(12) United States Patent
Matsumura et al.

(10) Patent No.: US 7,608,148 B2
(45) Date of Patent: *Oct. 27, 2009

(54) CRYSTALLIZATION APPARATUS AND CRYSTALLIZATION METHOD

(75) Inventors: Masakiyo Matsumura, Yokohama (JP); Yukio Taniguchi, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 410 days.

This patent is subject to a terminal disclaimer.

(21) Appl. No.: 11/520,751

(22) Filed: Sep. 14, 2006

(65) Prior Publication Data

US 2007/0006796 A1      Jan. 11, 2007

Related U.S. Application Data

(63) Continuation of application No. 10/724,261, filed on Dec. 1, 2003, now Pat. No. 7,217,319.

(30) Foreign Application Priority Data

Dec. 4, 2002 (JP) ............................. 2002-351955
Dec. 9, 2002 (JP) ............................. 2002-357254

(51) Int. Cl.
*C30B 1/02* (2006.01)

(52) U.S. Cl. .............................. 117/200; 117/4; 117/8; 117/9

(58) Field of Classification Search .................. 117/4, 117/5, 8, 9, 200
See application file for complete search history.

(56) References Cited

U.S. PATENT DOCUMENTS

| | | | |
|---|---|---|---|
| 7,001,461 B2 | 2/2006 | Taniguchi et al. | |
| 7,217,319 B2 * | 5/2007 | Matsumura et al. | 117/4 |
| 2002/0047580 A1 | 4/2002 | Kunji et al. | |
| 2006/0019503 A1 | 1/2006 | Takami | |
| 2006/0065185 A1 | 3/2006 | Taniguchi et al. | |

OTHER PUBLICATIONS

U.S. Appl. No. 11/861,885, filed Sep. 26, 2007, Taniguchi et al.

Masakiyo Matsumura, "Preparation of Ultra-Large Grain Silicon Thin-Film by Excimer-Laser," Surface Science, vol. 21, No. 5. Mar. 2000, pp. 278-287.

M. Nakata, et al., Two-Dimensionally Position-Controlled Ultra-Large Grain Growth Based on Phase-Modulated Excimer-Laser Annealing Method, Electrochemical Society Proceedings, vol. 2000-31, pp. 148-153.

(Continued)

*Primary Examiner*—Robert M Kunemund
(74) *Attorney, Agent, or Firm*—Oblon, Spivak, McClelland, Maier & Neustadt, L.L.P.

(57) ABSTRACT

A crystallization apparatus includes an illumination system which illuminates a phase shifter having a phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, the phase shifter has four or more even-numbered phase shift lines which intersect at a point constituting the phase shift portion. An area on one side and an area on the other side of each phase shift line have a phase difference of approximately 180 degrees.

22 Claims, 12 Drawing Sheets

OTHER PUBLICATIONS

Misura Nakata, et al. "A New Nucleation-SITE-Control Excimer-Laser-Crystallization Method," Japanese Journal of Applied Physics, Part 1 Regular Papers, Short Notes & Review Papers, vol. 45, No. 5, May 2001, pp. 3049-3054.

Chang-Ho Oh, Optimization of phase-modulated-excimer-laser annealing method for growing highly-packed large-grains in Si Thin-film, Applied Surface Science, 154-155, pp. 105-111.

M. Matsumura, Advanced Laser—Crystallization Technologies of Si for High-Performance TFTRs, ALTEDEC, pp. 263-266.

* cited by examiner

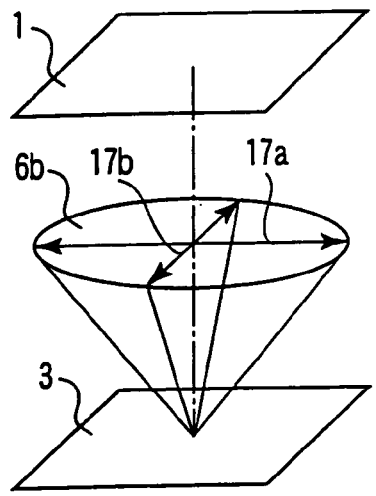
F I G. 11A
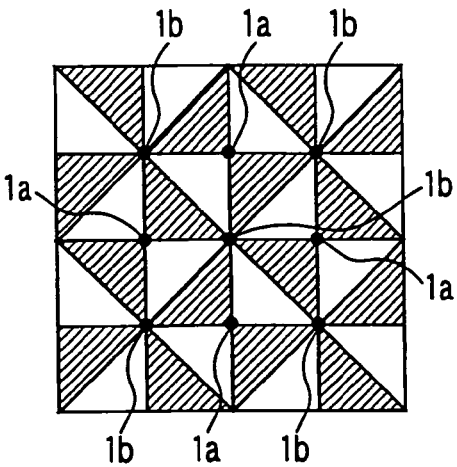
F I G. 13A
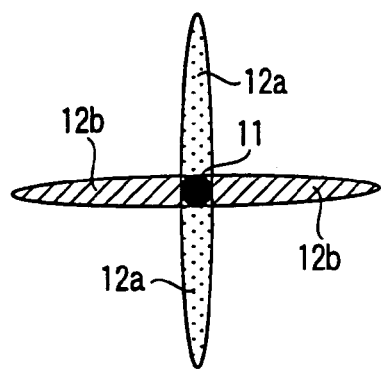
F I G. 11B
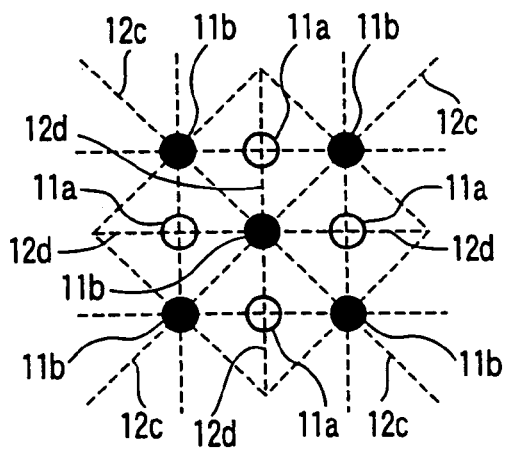
F I G. 13B
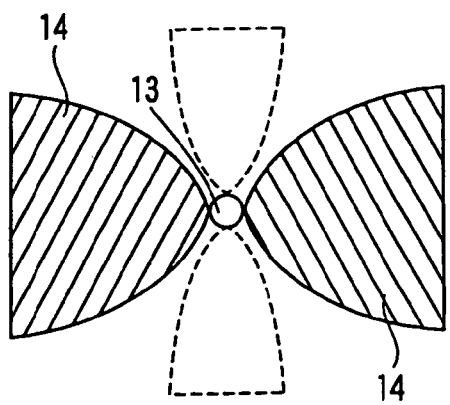
F I G. 11C
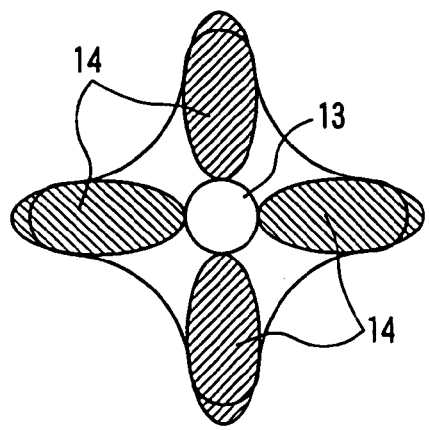
F I G. 13C

CRYSTALLIZATION APPARATUS AND CRYSTALLIZATION METHOD

CROSS-REFERENCE TO RELATED APPLICATIONS

The following application is a continuation of application Ser. No. 10/724,261, filed Dec. 1, 2003 now U.S. Pat. No. 7,217,319, which is based upon and claims the benefit of priority from the prior Japanese Patent Applications No. 2002-351955, filed Dec. 4, 2002; and No. 2002-357254, filed Dec. 9, 2002, the entire contents of each of these applications are incorporated herein by reference.

BACKGROUND OF THE INVENTION

1. Field of the Invention

The present invention relates to a crystallization technology, and more particularly to an apparatus and a method which form or generate a crystallized semiconductor film by irradiating a polycrystal semiconductor film or an amorphous semiconductor film with a laser beam phase-modulated by using a phase shifter, and to a phase shifter.

2. Description of the Related Art

In general, materials of a thin film transistor (TFT) used for, e.g., a switching element which controls a voltage to be applied to pixels in, e.g., a liquid crystal display (LCD) are roughly classified into amorphous silicon and polysilicon.

The polysilicon has higher electron mobility than that of the amorphous silicon. Therefore, when a transistor is formed by using the polycrystal silicon, a switching speed becomes higher than that when using the amorphous silicon, and a response of a display thereby becomes rapid. Further, a peripheral LSI can be also constituted of such thin film transistors. Furthermore, there is an advantage of reducing a design margin of any other component. Moreover, when incorporating peripheral circuits such as a driver circuit or a DAC other than a display main body in a display, these peripheral circuits can be operated at a higher speed.

The polycrystal silicon consists of an aggregate of crystal grains, and its electron mobility is lower than that of crystallized silicon or monocrystal silicon. In a small transistor formed by using polycrystal silicon, irregularities in crystal grain boundary number in a channel portion are a problem. Thus, there has been recently proposed a crystallization method to form crystallized silicon with a large particle size in order to improve the electron mobility and reduce irregularities in crystal grain boundary number in a channel portion.

As this type of crystallization method, there is known "phase control ELA (Excimer Laser Annealing)" which forms a crystallized semiconductor film by irradiating a line type phase shifter approximated in parallel with a polycrystal semiconductor film or an amorphous semiconductor film with an excimer laser beam. The detail of the phase control ELA is disclosed in, e.g., "Surface Science Vol. 21, No. 5, pp. 278-287, 2000".

In the phase control ELA, there is generated a light intensity distribution having an inverse peak pattern or patterns that a light intensity is substantially zero or minimum in a line corresponding to a phase shift portion of a phase shifter (pattern that a light intensity is minimum at the center and it is suddenly increased toward the periphery), and a polycrystal semiconductor film or an amorphous semiconductor film is irradiated with a light beam having this light intensity distribution with the inverse peak pattern. As a result, a temperature gradient is generated in a fusing area in accordance with the light intensity distribution, a crystal nucleus or nuclei are formed at a part or parts which solidify first in accordance with a point or points on a line where the light intensity is minimum or substantially minimum, and a crystal grows towards the periphery from the crystal nucleus in a lateral direction (lateral growth), thereby forming a crystal nucleus with a large particle size.

As shown in FIGS. 1A and 2A, the line type phase shifter is constituted of two types of rectangular areas 101a and 101b having different thicknesses which are alternately repeated along one direction (lateral direction) of a transparent substrate 100, and a phase difference of π (180 degrees) is given to a gap between the adjacent areas, i.e., a step portion 101c.

As shown in FIG. 1B, a light beam which has passed through such a phase shifter forms a light intensity distribution with an inverse peak pattern that a light intensity is minimum on a line 102 corresponding to a phase shift portion (boundary) 101c and the light intensity is one-dimensionally increased toward the periphery in a direction orthogonal to the line 102. FIG. 2B concretely shows this light intensity distribution.

When a processed substrate is irradiated with the light having such a light intensity distribution, a temperature distribution becomes lowest along the line 102 corresponding to the phase shift portion 101C, and a temperature gradient (indicated by each arrow in the drawing) is generated in a direction orthogonal to the line 102 corresponding to the phase shift portion. As a result, each crystal nucleus 103 is generated on the line 102 corresponding to the phase shift portion 101C as shown in FIG. 1C, and crystallization advances, in a lateral direction, that is a direction orthogonal to the line 102 corresponding to the phase shift portion from that crystal nucleus 103. In FIG. 1C, curves 104 indicate a crystal grain boundary, and crystal grains are formed in an area defined by these crystal grain boundaries 104.

In such a crystallization method, although the crystal nucleus 103 is generated on the line 102 corresponding to the phase shift portion 101C, a position on the line 102 where the crystal nucleus 103 or nuclei are generated is uncertain. In other words, when the line type phase shifter is used, any position at which the crystal nucleus 103 is generated cannot be controlled by the phase shift portion, and it is hence impossible to two-dimensionally control a crystal formation area.

Additionally, in the light intensity distribution obtained by using the line type phase shifter, as shown in FIG. 2B, it is general to involve irregular undulations in a middle portion PM between two adjacent inverse peak pattern portions PP (wavelike distribution that an increase and a decrease in light intensity are repeated). In this case, a crystal nucleus 103b may be generated at a position where the light intensity is low in undulations in the middle portion MP (i.e., at an undesired position) in some cases. Further, even if a crystal nucleus is generated at a desired position, the lateral growth which has started from the crystal nucleus toward the periphery is stopped at a part where the light intensity is decreased at the boundary between the inverse peak pattern portion and the middle portion, which prevents growth of a large crystal.

BRIEF SUMMARY OF THE INVENTION

It is an object of the present invention to provide a crystallization apparatus and a crystallization method which can two-dimensionally generate a crystal nucleus at a desired position and realize a sufficient lateral growth from a crystal nucleus, thereby producing a crystallized semiconductor film with a large particle size.

A crystallization apparatus according to a first aspect of the present invention includes an illumination system which illuminates a phase shifter, and irradiates a polycrystal semiconductor film or an amorphous semiconductor film with a light beam having a predetermined light intensity distribution that a light intensity is minimum in an area corresponding to a phase shift portion of the phase shifter, thereby forming or growing a crystallized semiconductor film. The phase shifter has a four or more even-numbered phase shift lines which intersect at a point constituting the phase shift portion, and an area on one side and an area on the other side of each phase shift line preferably have a phase difference of approximately 180 degrees.

The phase shifter may has a conformation that four rectangular areas are arranged so as to be adjacent to each other with one apex in common. Alternatively, it is preferable that the phase shifter has a conformation that six or more triangular areas are arranged so as to be adjacent to each other with one apex in common. Alternatively, it is preferable that the phase shifter has a conformation that it has a first phase shift portion at which even-numbered first phase shift lines intersect and a second phase shift portion at which even-numbered second phase shift lines intersect and a plurality of first phase shift portions and a plurality of second phase shift portions are alternately arranged. In this case, it is preferable that the first phase shift portion corresponds to a point at which the four phase shift lines intersect and the second phase shift portion corresponds to a point at which the eight phase shift lines intersect. Furthermore, in this case, it is preferable that the first phase shift portion corresponds to one apex provided to the four triangular areas in common and the second phase shift portion corresponds to one apex provided to the eight triangular areas in common.

Moreover, according to the first aspect, it is preferable that the polycrystal semiconductor film or the amorphous semiconductor film and the phase shifter are arranged in parallel with and in close proximity to each other. In this case, it is preferable that an outgoing radiation pupil of the illumination system has a shape that a dimension along one direction and a dimension along the other direction are substantially different from each other. Additionally, in this case, assuming that D is a distance between the polycrystal semiconductor film or the amorphous semiconductor film and the phase shifter, λ is a wavelength of a light beam, θmax is a maximum incident angle of the light upon the phase shifter along a direction that the outgoing radiation pupil of the illumination system is maximum and θmin is a maximum incident angle of the light upon the phase shifter along a direction that the outgoing radiation pupil of the illumination system is minimum, it is preferable to satisfy the following conditions:

$$D \times \tan(\theta min) < 1.2 \times (\lambda D/2)^{1/2}$$

$$D \times \tan(\theta max) > 1.2 \times (\lambda D/2)^{1/2}$$

Further, according to the first aspect, preferably, the crystallization apparatus further includes an image forming optical system arranged on a light path between the polycrystal semiconductor film or the amorphous semiconductor film and the phase shifter, and the polycrystal semiconductor film or the amorphous semiconductor film is set apart from a surface optically conjugate with the phase shifter by a predetermined distance along an optical axis of the image forming optical system.

Alternatively, according to the first aspect, preferably, the crystallization apparatus further includes an image forming optical system which is arranged on a light path between the polycrystal semiconductor film or the amorphous semiconductor film and the phase shifter, the polycrystal semiconductor film or the amorphous semiconductor film is set to a surface optically substantially conjugate with the phase shifter, and an image side numerical aperture of the image forming optical system is set to a value required to generate the predetermined light intensity distribution. In this case, it is preferable that the pupil of the image forming optical system has a shape that a dimension along one direction and a dimension along the other direction are substantially different from each other.

A crystallization apparatus according to a second aspect of the present invention forms a crystallized semiconductor film by irradiating a polycrystal semiconductor film or an amorphous semiconductor film with a light beam having a predetermined light intensity distribution. There is provided the crystallization apparatus characterized in that the predetermined light intensity distribution has an inverse peak point with a light intensity lower than that at the periphery and has two or more trough lines each of which extends from the inverse peak point to the periphery and has a lower change gradient is of the light intensity than that at the periphery. In this case, it is preferable that the light intensity distribution along the trough lines has an inflection point.

A crystallization method according to a third aspect of the present invention illuminates a phase shifter, and irradiates a polycrystal semiconductor film or an amorphous semiconductor film with a light beam having a predetermined light intensity that a light intensity is minimum in an area corresponding to a phase shift portion of the phase shifter, thereby forming a crystallized semiconductor film. This method may use a phase shifter which has four or more even-numbered phase shift lines which intersect at a point constituting the phase shift portion and in which an area on one side and an area on the other side of each phase shift line have a phase difference of approximately 180 degrees.

According to the third embodiment, it is preferable to arrange the polycrystal semiconductor film or the amorphous semiconductor film and the phase shifter in parallel with and in close proximity to each other. Alternatively, it is preferable that an image forming optical system is arranged on a light path between the polycrystal semiconductor film or the amorphous semiconductor film and the phase shifter, and a surface of the polycrystal semiconductor film or the amorphous semiconductor film is set apart from a surface optically conjugate with the phase shifter by a predetermined distance along an optical axis of the image forming optical system. Alternatively, it is preferable to arrange the image forming optical system on the light path between the polycrystal semiconductor film or the amorphous semiconductor film and the phase shifter, set an image side numerical aperture of the image forming optical system to a value required to generate the predetermined light intensity distribution, and set the polycrystal semiconductor film or the amorphous semiconductor film at a position optically conjugate with the phase shifter through the image forming optical system.

A crystallization method according to a fourth aspect of the present invention forms a crystallized semiconductor film by irradiating a polycrystal semiconductor film or an amorphous semiconductor film with a light beam having a predetermined light intensity distribution. The polycrystal semiconductor film or the amorphous semiconductor film is irradiated with a light beam having a light intensity distribution which has an inverse peak point with a light intensity lower than that at the periphery and has two or more trough lines each of which extends from the inverse peak point toward the periphery and has a lower change gradient of the light intensity than that at the periphery.

A phase shifter according to a fifth aspect of the present invention has four or more even-numbered phase shift lines which intersect at a point constituting a phase shift portion, and an area on one side and an area on the other side of each phase shift line have a phase difference of approximately 180 degrees.

According to the fifth aspect, it is preferable that four rectangular areas preferably have a conformation that they are arranged so as to be adjacent to each other with one apex in common. Alternatively, it is preferable that six or more triangular areas have a conformation that they are arranged so as to be adjacent to each other with one apex in common. Alternatively, it is preferable to have a conformation that there are a first phase shift portion at which even-numbered first phase shift lines intersect and a second phase shift portion at which even-numbered second phase shift lines intersect, and a plurality of first phase shift portions and a plurality of second phase shift portions are alternately arranged. In this case, it is preferable that the first phase shift portion corresponds to a point at which the four phase shift lines intersect and the second phase shift portion corresponds to a point at which the eight phase shift lines intersect. Furthermore, in this case, it is preferable that the first phase shift portion corresponds to one apex provided to the four triangular areas in common and the second phase shift portion corresponds to one apex provided to the eight triangular areas in common.

As described above, in the technology according to the present invention, since there is used the phase shifter which has four or more even-numbered phase shift lines intersecting at a point constituting the phase shift portion and in which an area on one side and an area on the other side of each phase shift line have a phase difference of approximately 180 degrees, a crystal nucleus can be generated in an area corresponding to the phase shift portion, and a defocus effect or a blurring effect which is relatively larger than that of the line type phase shifter can be added. Therefore, the light intensity distribution in the area corresponding to the phase shift portion does not involve irregular undulations. Accordingly, the lateral growth which has started from the crystal nucleus toward the periphery does not stop in mid course, and a single crystal or polycrystal with a large particle size can be generated. As a result, in the present invention, a crystal nucleus or a crystal growth start point can be produced at a desired position, the sufficient lateral growth from the crystal nucleus can be realized, thereby generating a crystallized semiconductor film with a large particle size.

Objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 1A to 1C are views illustrating a structure and an effect of a conventional line type phase shifter, in which FIG. 1A is a plane view of a basic unit part of a phase shifter (hatching is used in order to clarify a difference from another area, does not show a cross section, and is used in any of the following figures for the same purpose), FIG. 1B is a view showing a crystal growth direction on a processed substrate, and FIG. 1C is a view showing crystal grains and crystal nuclei to be formed;

FIGS. 4A to 4C are views schematically showing a structure and an effect of a basic unit part of the phase shifter according to the first embodiment, in which FIG. 4A is a plane view of the basic unit part of the phase shifter, FIG. 4B is a view showing a light intensity distribution on the processed substrate, and FIG. 4C is a view showing crystal grains and crystal nuclei to be formed;

FIGS. 6A to 6C are views illustrating a primary structure and an effect of a crystallization apparatus according to a first modification of the first embodiment, in which FIG. 6A is a view showing a relationship between an outgoing radiation pupil of an illumination system, a phase shifter and a processed substrate, FIG. 6B is a view showing a light intensity distribution on the processed substrate, and FIG. 6C is a view showing crystal grains and crystal nuclei to be formed;

FIGS. 11A to 11C are views illustrating a primary structure and an effect of a crystallization apparatus according to a modification of the third embodiment, in which FIG. 11A is a view showing a relationship between an outgoing radiation pupil of an illumination system, a phase shifter and a processed substrate, FIG. 11B is a view showing a light intensity distribution on the processed substrate, and FIG. 11C is a view showing crystal grains and crystal nuclei to be formed;

FIGS. 13A to 13C are views schematically showing a structure and an effect of still another conformation of the phase shifter applicable to each embodiment and each modification, in which FIG. 13A is a view showing a relationship between an outgoing radiation pupil of an illumination system, a phase shifter and a processed substrate, FIG. 13B is a view showing a light intensity distribution on the processed substrate, and FIG. 13C is a view showing crystal grains and crystal nuclei to be formed;

DETAILED DESCRIPTION OF THE INVENTION

Embodiments according to the present invention will now be described with reference to the accompanying drawings.

Figure 1A:
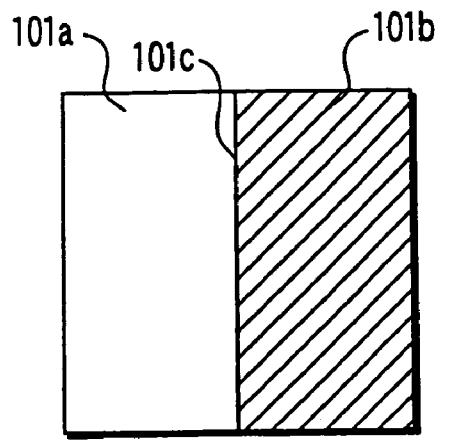
Figure 1B:
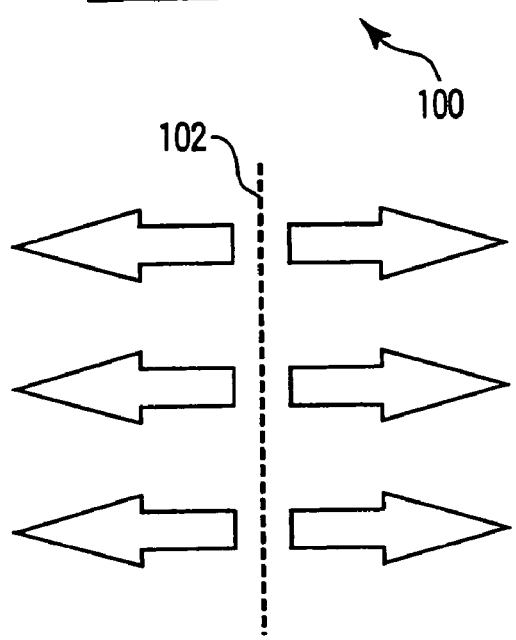
Figure 1C:
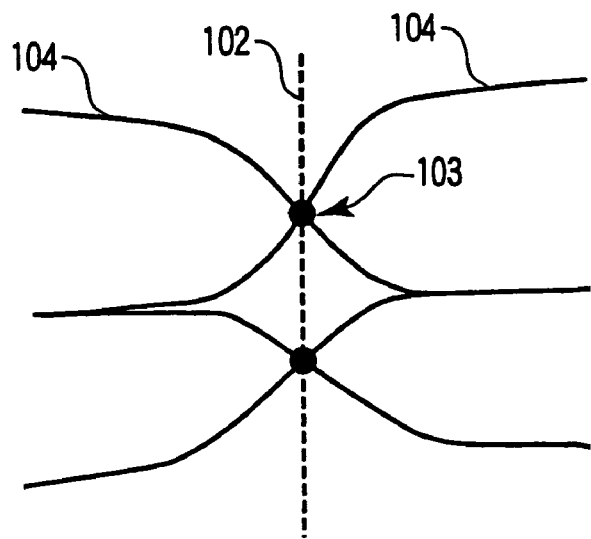
Figure 2A:
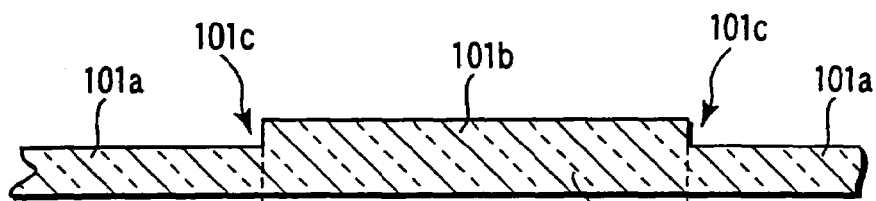
FIGS. 2A and 2B are views respectively showing a line type phase shifter and a light intensity distribution obtained by using the phase shifter.
Figure 2B:
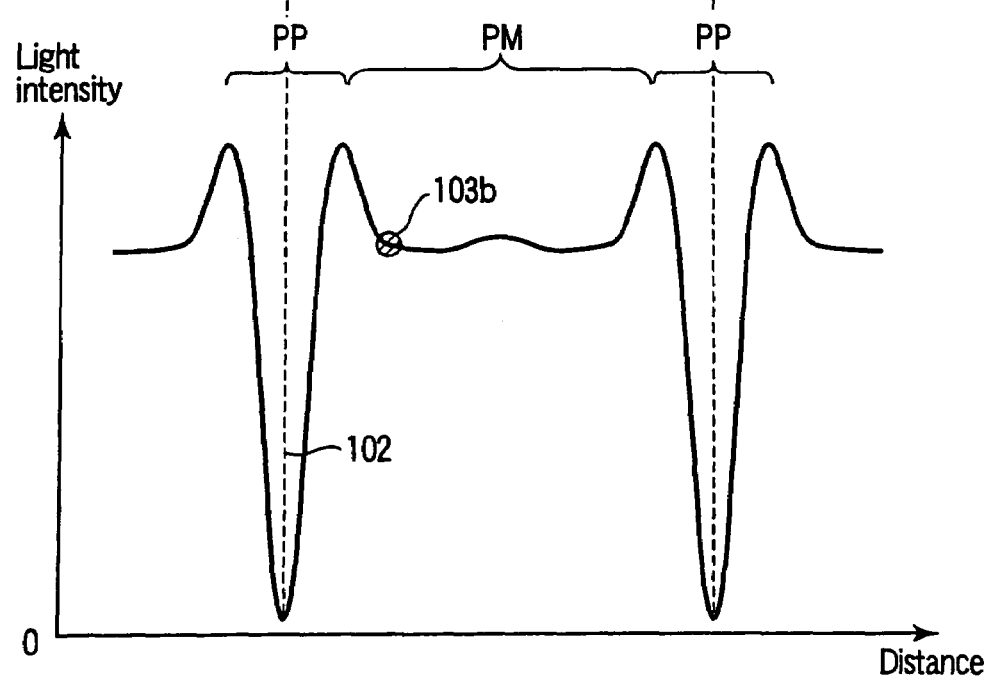
Figure 3:
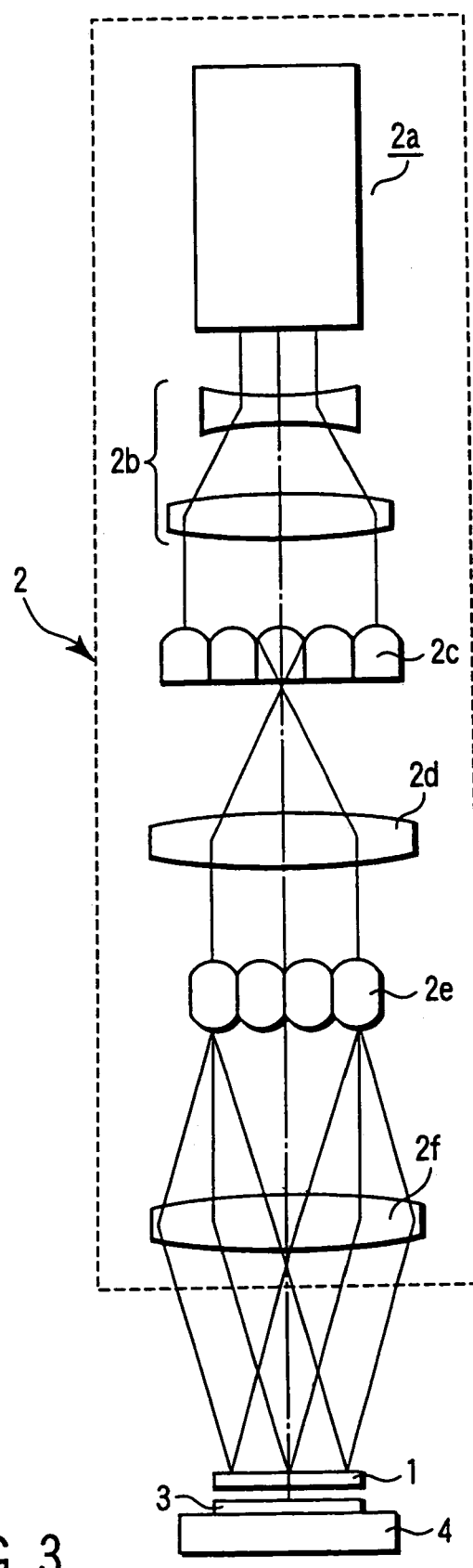
FIG. 3 is a view schematically showing a structure of a crystallization apparatus according to a first embodiment of the present invention.

FIG. 3 is a view schematically showing a structure of a crystallization apparatus according to a first embodiment of the present invention. The crystallization apparatus according to the first embodiment includes an illumination system 2 which illuminates a phase shifter 1. The illumination system 2 includes a KrF excimer laser beam source 2a which emits a light beam having a wavelength of, e.g., 248 nm. As the light source 2a, any other appropriate light source such as an XeCl excimer laser beam source can be also used. The laser beam emitted from the light source 2a is expanded through a beam expander 2b, and then enters a first fly-eye lens 2c.

A plurality of small light sources are formed on a rear focal plane of the first fly-eye lens 2c in this manner, and an incident plane of a second fly-eye lens 2e is illuminated with a light flux from the plurality of light sources through a first condenser optical system 2d in the superimposed manner. As a result, more small light sources than those on the rear focal plane of the first fly-eye lens 2c are formed on a rear focal plane of the second fly-eye lens 2e. The phase shifter 1 is illuminated in the superimposed manner with a light flux or beam from the plurality of light sources formed on the rear focal plane of the second fly-eye lens 2e through a second condenser optical system 2f.

The first fly-eye lens 2c and the first condenser optical system 2d constitute a first homogenizer, and the first homogenizer performs equalization concerning incident angles on the phase shifter 1. Further, the second fly-eye lens 2e and the second condenser optical system 2f constitute a second homogenizer, and the second homogenizer achieves equalization concerning in-plane positions on the phase shifter 1. Therefore, the illumination system 2 irradiates the phase shifter 1 with the light having a substantially even light intensity distribution.

A processed substrate 3 arranged in parallel with and in close proximity to the phase shifter 1 is irradiated with the laser beam supplied through the phase shifter 1. Here, the processed substrate 3 is obtained by forming an underlying film and an amorphous silicon film on, e.g., a liquid crystal display glass sheet by chemical vapor deposition. In other words, the phase shifter 1 is set so as to be opposed to the amorphous semiconductor film. The processed substrate 3 is held at a predetermined position on a substrate stage 4 by a vacuum chuck or an electrostatic chuck.

Figure 4A:
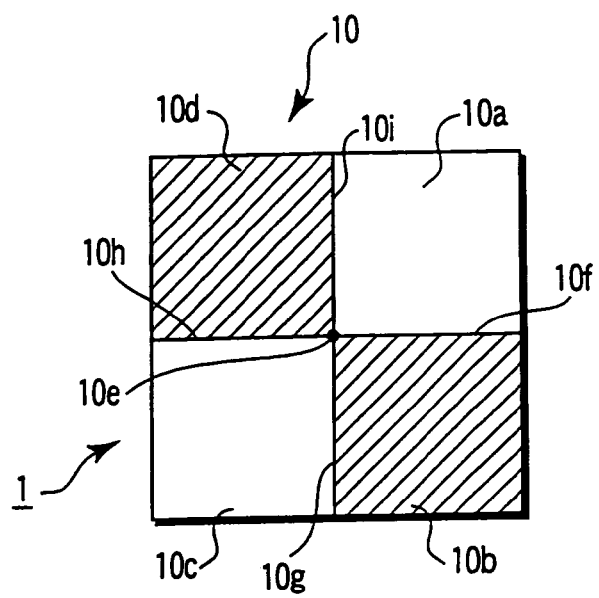
Figure 4B:
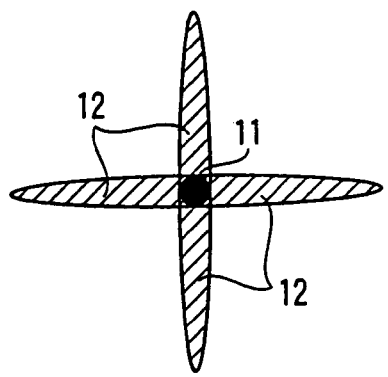
Figure 4C:
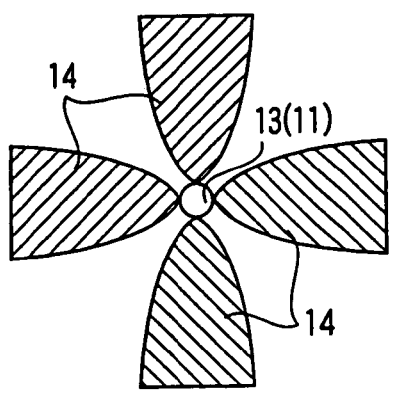
Figure 5:
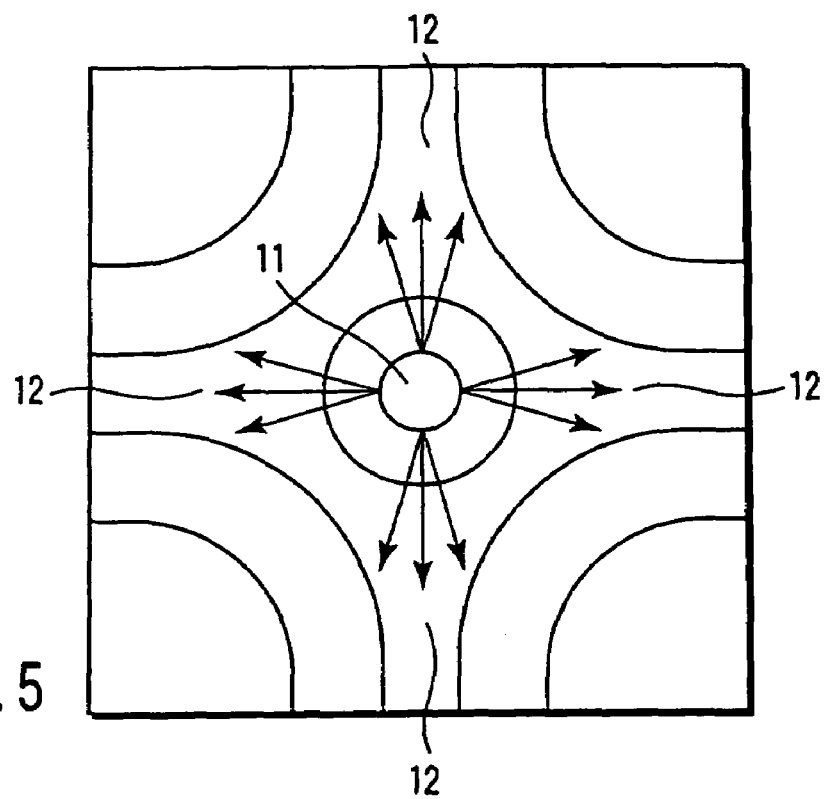
FIG. 5 is a view typically showing a light intensity distribution obtained on the processed substrate by using the phase shifter shown in FIG. 4A by contour lines in the first embodiment.

FIGS. 4A to 4C are views schematically showing a structure and an effect of a basic unit part of the phase shifter in the first embodiment. FIG. 5 is a view typically showing a light intensity distribution obtained on the processed substrate by using the phase shifter depicted in FIG. 4A by contour lines in the first embodiment. Referring to FIG. 4A, a basic unit part 10 of the phase shifter 1 has a conformation that four rectangular, preferably, square areas 10a to 10d are arranged so as to be adjacent to each other with one apex 10e in common. Here, with the transmitted light in the first area 10a being determined as a reference, a phase difference of 180 degrees is given to the transmitted light in the second area 10b and the transmitted light in the fourth area 10d, and a phase difference relative to the first area 10a is not given (phase difference of 0 degrees is given) to the transmitted light in the third area 10c. Since the first area 10a and the third area 10c are in phase and the second area 10b and the fourth area 10d are in phase, the former is indicated by a white space and the latter is indicated by hatching in FIG. 4A for better understanding.

In the rectangular, preferably, square basic unit part 10, a boundary between the first area 10a and the second area 10b constitutes a first phase shift line 10f, a boundary between the second area 10b and the third area 10c constitutes a second phase shift line 10g, a boundary between the third area 10c and the fourth area 10d constitutes a third phase shift line 10h, and a boundary between the fourth area 10d and the first area 10a constitutes a fourth phase shift line 10i. These phase shift lines 10f, 10g, 10h and 10i intersect at the center of the basic unit part 10 and constitute an apex 10e. The apex 10e is a phase shift point or a phase shift portion. As a result, the basic unit part 10 has the four phase shift lines 10f to 10i which intersect at the phase shift portion 10e, and an area on one side and an area on the other side of each phase shift line has a phase difference of 180 degrees.

Specifically, when the phase shifter is formed of, e.g., quartz glass having a refractive index of 1.5 relative to the light having a wavelength of 248 nm, a step of 248 nm is given between the first area 10a and the second area 10b, between the second area 10b and the third area 10c, between the third area 10c and the fourth area 10d and between the fourth area 10d and the first area 10a, respectively. The phase shifter 1 is constituted by one-dimensionally or two-dimensionally arranging a plurality of basic unit parts 10 according to needs. In the phase shifter 1, its phase shift surface (irregular pattern) is preferably formed on a surface opposed to the processed substrate 3.

When the phase shifter 1 and the processed substrate 3 are arranged so as to be appressed against each other, a cruciform light intensity distribution having a relatively low light intensity is formed at a part corresponding to the four phase shift lines 10f to 10i. However, in the first embodiment, since the phase shifter 1 and the processed substrate 3 are arranged in close proximity to each other, there is formed a predetermined light intensity distribution that a light intensity is minimum in a light irradiation area corresponding to the phase shift portion 10e or a point 11 and the light intensity is relatively low in a cruciform light irradiation area corresponding to the four phase shift lines 10f to 10i or lines 12 by a so-called defocus effect (blurring effect). FIGS. 4B and 5 show that the minimum light intensity point 11 is the center and the weak light intensity area 12 extends crosswise from the minimum light intensity point 11.

The light intensity distribution depicted in FIG. 5 typically shows a simulation result obtained based on a specific numerical example. In this numerical example, it is assumed that each of the areas 10a to 10d of the phase shifter 1 has a square shape of 5 μm×5 μm, a wavelength λ of the light is 248 nm, a distance D between the phase shifter 1 and the processed substrate 3 is 48 µm and a surface light source formed to an outgoing radiation pupil (rear focal plane of the second fly-eye lens 2e) of the illumination system 2 has a circular shape (i.e., a circular illumination). An area 12 with a relatively weak intensity extends in directions indicated by arrows (which become a crystal growth direction), and the intensity becomes higher in areas on both sides of the area 12 as distanced from the line area 12.

Therefore, in the first embodiment, as shown in FIG. 4C, a crystal nucleus 13 can be formed in an area 11 corresponding to the phase shift portion 10e. At this time, as compared with the line type phase shifter, since the four phase shift lines intersect at the phase shift portion 10e, the inverse peak pattern is hard to be eliminated even if a large defocus effect is given. On the contrary, in the first embodiment, the large defocus effect can be given, and irregular undulations (wave-like distribution that an increase and a decrease in light intensity are repeated) can be thereby eliminated from the light intensity distribution in the cruciform area 12 corresponding to the four phase shift lines 10f to 10i. As a result, crystal grain 14 with a large particle size are generated without stopping in mid course the lateral growth which has started crosswise from the crystal nucleus 13 toward the periphery in the four directions. Thus, in the first embodiment based on a so-called proximity method (defocus method), the crystal nucleus can be generated at a two-dimensional position (in directions X and y) of the processed substrate, and the sufficient lateral growth can be realized from the crystal nucleus, thereby producing a crystallized semiconductor film with a large particle size.

Figure 6A:
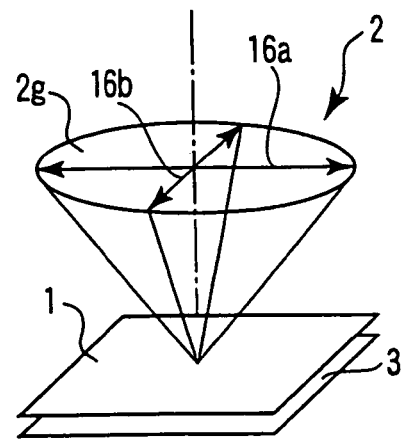
Figure 6B:
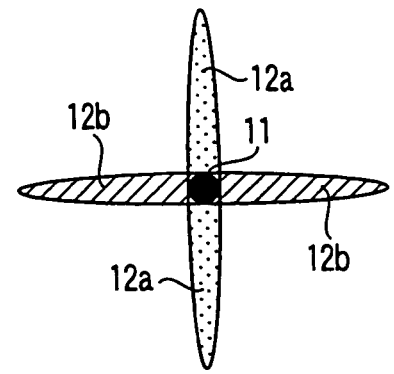
Figure 6C:
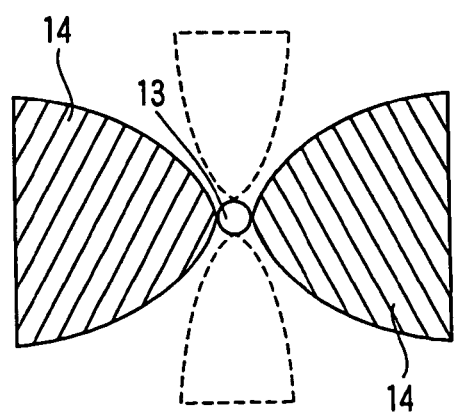
Figure 7:
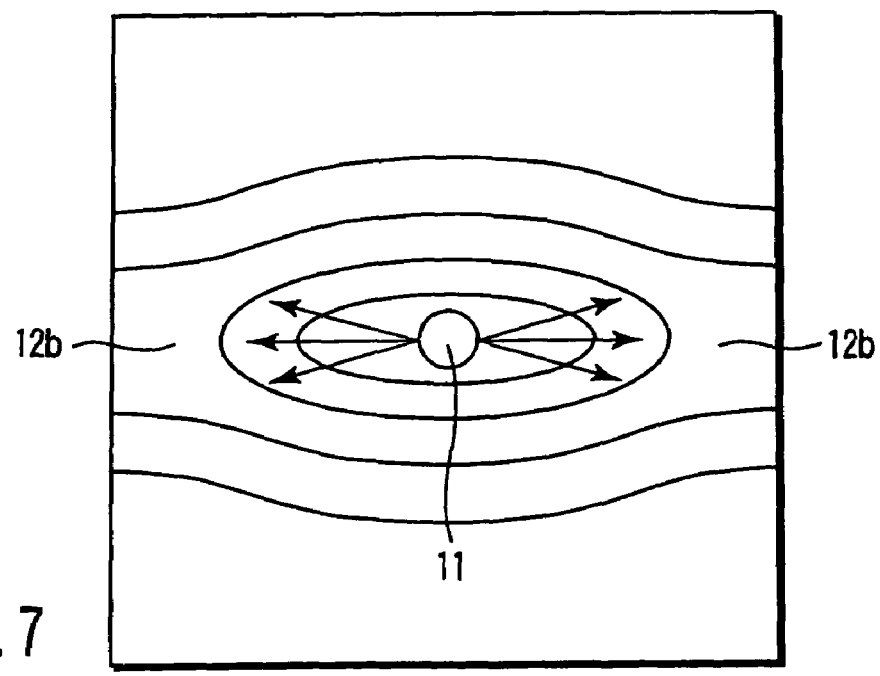
FIG. 7 is a view typically showing a light intensity distribution obtained on the processed substrate by using the phase shifter depicted in FIG. 4A in the first modification of the first embodiment.

FIGS. 6A to 6C are views showing a primary structure and an effect of a crystallization apparatus according to a first modification of the first embodiment. FIG. 7 is a view typically showing a light intensity distribution obtained on the processed substrate by using the phase shifter depicted in FIG. 4A in the first modification by contour lines. Although the modification shown in FIG. 6A has a structure similar to the first embodiment, it is basically different from the first embodiment in that the outgoing radiation pupil of the illumination system has a shape that a dimension along one direction and a dimension along the other direction are substantially different from each other. Taking notice of the difference from the first embodiment, the modification will be described hereinafter with reference to FIGS. 6A to 6C.

Referring to FIG. 6A, a surface light source 2g formed to the outgoing radiation pupil of the illumination system 2 has an elliptic shape instead of a circular shape. That is, a dimension of the outgoing radiation pupil 2g of the illumination system 2 is largest along a first direction (major axis direction) 16a, and it is smallest along a second direction (minor axis direction) 16b orthogonal to the first direction. Therefore, the defocus effect becomes maximum along the first direction 16a along which the outgoing radiation pupil 2g of the illumination system 2 is largest, and the defocus effect becomes minimum along the second direction 16b along which the outgoing radiation pupil 2g is smallest. As a result, as shown in FIGS. 6B and 7, a light intensity in an area 12a affected by the phase shift lines corresponding to the first direction 16a is higher (shallower) than a light intensity in an area 12b affected by the phase shift lines corresponding to the second direction 16b.

A light intensity distribution shown in FIG. 7 typically shows a simulation result obtained based on a specific numerical example. In this numerical example, it is assumed that each of the areas 10a to 10d of the phase shifter 1 has a square shape of 5 µm×5 µm, a wavelength λ of the light is 248 nm and a distance D between the phase shifter 1 and the processed substrate 3 is 48 µm. However, as different from the first embodiment, it is assumed that a shape of the surface light source 2g formed to the outgoing radiation pupil of the illumination system 2 is an ellipse that a major axis: a minor axis is 6:5 (i.e., an elliptic illumination).

The light intensity distribution shown in FIG. 7 has an inverse peak point 11 with a lower light intensity than that at the periphery, and it has two trough lines (areas affected by the phase shift lines corresponding to the second direction 16b) 12b which extend from the inverse peak point 11 to the periphery and have a lower change gradient of the light intensity than that at the periphery. That is, the area 12b in which the light intensity is relatively weak in a straight line form is formed around the minimum intensity area 11. Consequently, as shown in FIG. 6C, in the modification of the first embodiment, a crystal nucleus 13 is generated in the point area 11 corresponding to the phase shift portion 10e like the first embodiment. However, as different from the first embodiment, the lateral growth does not start along the area 12a which is orthogonal to the linear area 12b and has a high (shallow) light intensity, and the lateral growth starts along only the area 12b having a lower (deep) light intensity by priority. As a result, as different from the first embodiment, the lateral growth advances without being affected by adjacent crystals, and hence crystal grain 14 larger than those in the first embodiment can be produced.

Figure 8:
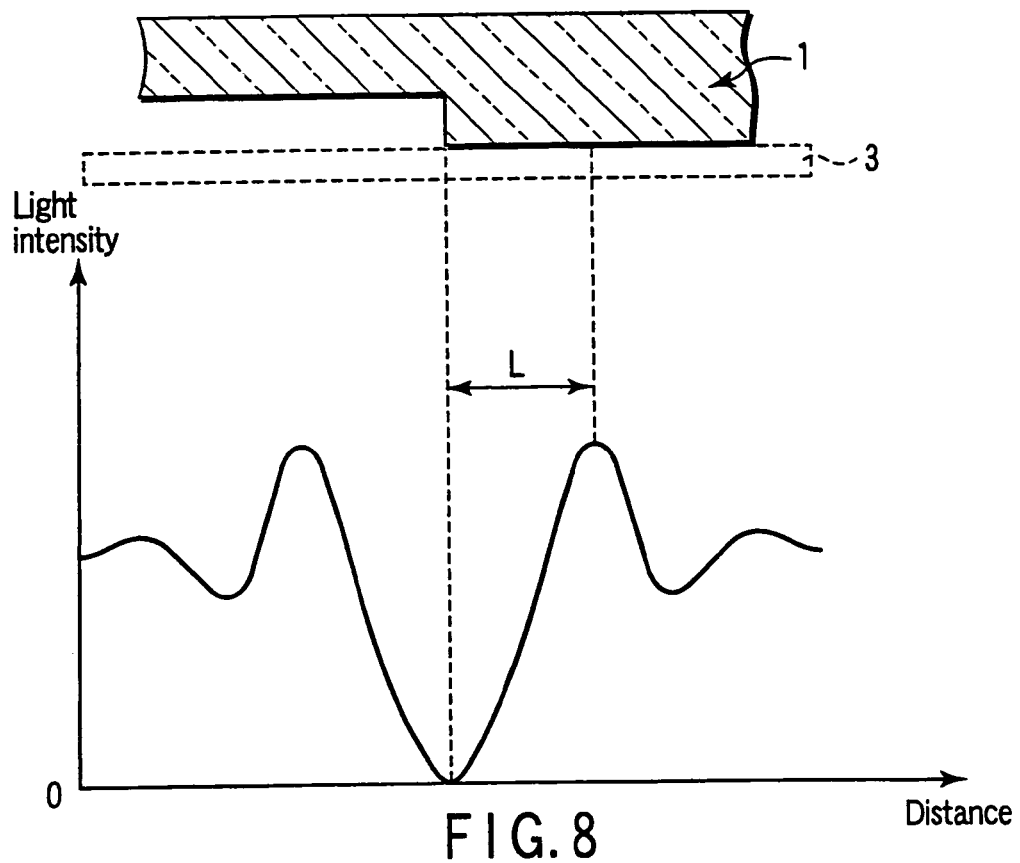
FIG. 8 is a view illustrating dimensions of the outgoing radiation pupil of the illumination system required in the modification of the first embodiment, and further showing the phase shifter and a light intensity distribution.

FIG. 8 is a view illustrating a dimension of the outgoing radiation pupil of the illumination system required in the modification of the first embodiment. Referring to FIG. 8, in the light intensity distribution formed on the processed substrate by the phase shifter 1, a half value width L of the inverse peak pattern around the phase shift point can be represented by the following expression (1). In the expression (1), as described above, λ is a wavelength of the light from the illumination system, and D is a distance between the phase shifter 1 and the processed substrate 3.

$$L = 1.2 \times (\lambda D/2)^{1/2} \quad (1)$$

On the other hand, a defocus quantity (blurring quantity) B based on the illumination light passing through an outgoing radiation pupil end of the illumination system 2 can be represented by the following expression (2). It is to be noted that θ is the maximum incident angle of the light upon the phase shifter 1 along a direction to be considered.

$$B = D \times \tan\theta \quad (2)$$

When the defocus quantity exceeds the half value width L, a light intensity of the inverse peak becomes high (shallow) by the defocus effect although it is a continuous change, and the inverse peak pattern starts becoming shallower. Therefore, in the light intensity distribution depicted in FIG. 6B, the light intensity of the inverse peak in the area (trough line) 12a becomes shallow. As to conditions for the light intensity of the inverse peak in the area (trough line) 12 to become shallow in the area (trough line) 12b, B>L is attained along the first direction 16a that the outgoing radiation pupil of the illumination system 2 is maximum, and B<L is achieved along the first line 16b that the outgoing radiation pupil 2g is minimum.

In this manner, the dimension of the outgoing radiation pupil 2g of the illumination system 2 required in the modification of the first embodiment, i.e., the maximum incident angle θmax of the light upon the phase shifter 1 and the maximum incident angle θmin of the light upon the phase shifter 1 are defined by the following conditional expressions (3) and (4).

$$D \times \tan(\theta\min) < 1.2 \times (\lambda D/2)^{1/2} \quad (3)$$

$D \times \tan(\theta \max) > 1.2 \times (\lambda D/2)^{1/2}$ (4)

Figure 9:
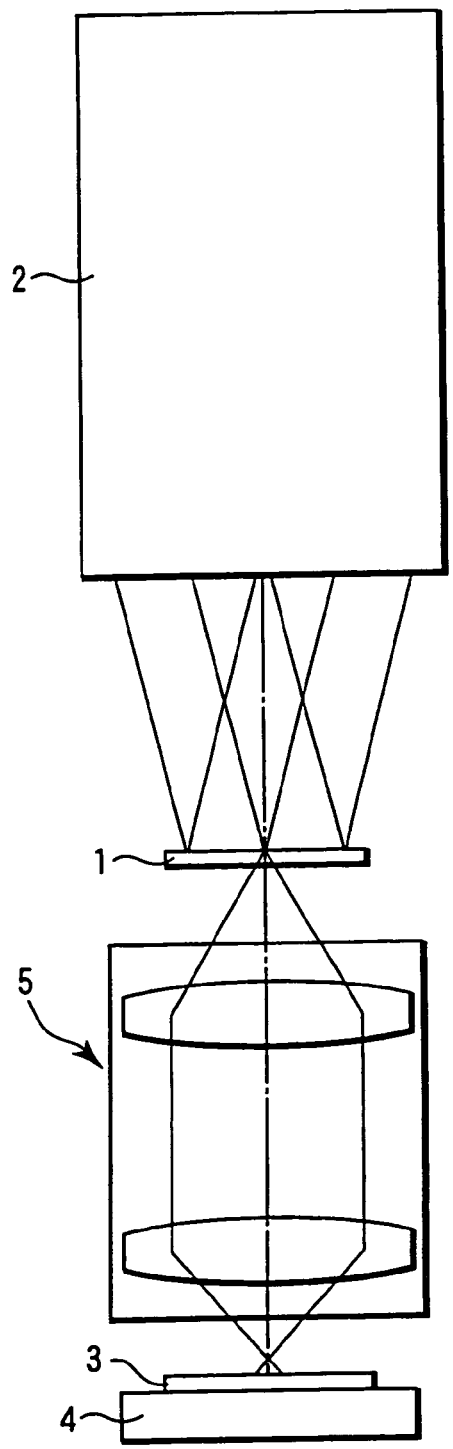
FIG. 9 is a view schematically showing a structure of a crystallization apparatus according to a second embodiment of the present invention.

FIG. 9 is a view schematically showing a structure of a crystallization apparatus according to a second embodiment of the present invention. Although the second embodiment has a structure similar to that of the first embodiment, the second embodiment is basically different from the first embodiment in that an image forming optical system 5 is included on a light path between the phase shifter 1 and the processed substrate 3. Taking notice of the difference from the first embodiment, the second embodiment will be described hereinafter. It is to be noted that the illustration of an internal structure of the illumination system 2 is eliminated for clarifying the drawing in FIG. 9.

In the second embodiment, as shown in FIG. 9, the processed substrate 3 is set apart from a plane (image surface of the image forming optical system 5) optically conjugate with the phase shifter 1 by a predetermined distance along the optical axis. It is to be noted that the image forming optical system 5 (and a later-described image forming optical system 6) may be a refraction type optical system, a reflection type optical system or a refraction/reflection type optical system. In the second embodiment based on a so-called projection defocus method, the same desired light intensity distribution as that in the first embodiment can be likewise formed on the processed substrate 3 by using the phase shifter 1, and a crystal nucleus can be produced at a desired position. Furthermore, the sufficient lateral growth from the crystal nucleus can be realized, thereby producing a crystallized semiconductor film with a large particle size.

In the first embodiment, since the phase shifter 1 is appressed against or in close proximity to the processed substrate 3, the phase shifter 1 may be contaminated due to ablation in the processed substrate 3 and the excellent crystallization may be obstructed. On the contrary, in the second embodiment, since the image forming optical system 5 is interposed between the phase shifter 1 and the processed substrate 3 and a distance between the processed substrate 3 and the image forming optical system 5 is relatively largely assured, the excellent crystallization can be realized without being affected by ablation in the processed substrate 3.

In the first embodiment, since a distance which should be set between the phase shifter 1 and the processed substrate 3 is very small (e.g., several μm to several-hundred μm), a detection light beam used to detect a position is hard to be introduced in a narrow light path between the phase shifter 1 and the processed substrate 3, and it is hence difficult to adjust a distance between the phase shifter 1 and the processed substrate 3. On the contrary, in the second embodiment, since the distance between the processed substrate 3 and the image forming optical system 5 is relatively largely assured, it is easy to introduce the detection light for positional detection in the light path between these members and adjust a positional relationship between the processed substrate 3 and the image forming optical system 5.

Figure 10:
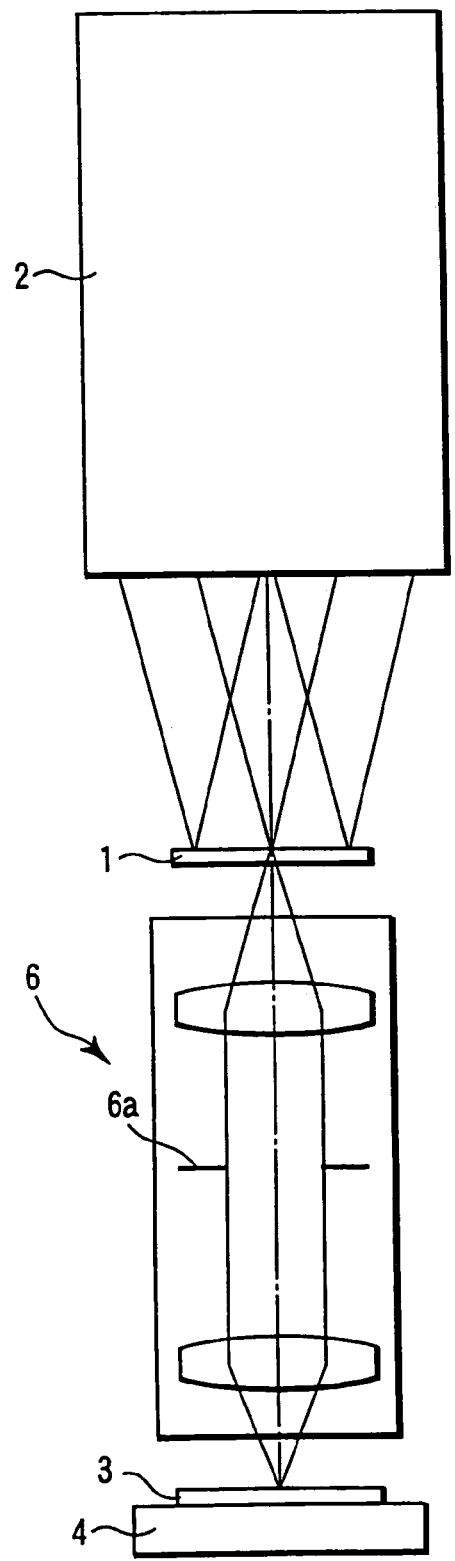
FIG. 10 is a view schematically showing a structure of a crystallization apparatus according to a third embodiment of the present invention.

FIG. 10 is a view schematically showing a structure of a crystallization apparatus according to a third embodiment of the present invention. Although the third embodiment has a structure similar to that of the second embodiment, the third embodiment is basically different from the second embodiment in that the phase shifter 1 and the processed substrate 3 are optically conjugatively arranged through an image forming optical system 6. Taking notice of the difference from the second embodiment, the third embodiment will be described hereinafter. It is to be noted that the illustration of an internal structure of the illumination system 2 is likewise eliminated in FIG. 10 for clarifying the drawing.

In the third embodiment, the image forming optical system 6 includes an aperture diaphragm 6a arranged at its pupil (outgoing radiation pupil). The aperture diaphragm 6a has a circular aperture portion (light transmission portion). In this case, a plurality of aperture diaphragms whose apertures portions are different in size are prepared, and the plurality of aperture diaphragms are constituted so as to be switched with respect to the light path. Alternatively, the aperture diaphragm 6a may be an iris diaphragm which can continuously or intermittently change a size of a circular aperture portion. In any case, a size of the aperture portion of the aperture diaphragm 6a (i.e., an image side numerical aperture of the image forming optical system 6) is set so as to generate a predetermined light intensity distribution on a semiconductor substrate 3.

In the third embodiment based on a so-called projection NA method, like the first and second embodiments, a desired light intensity distribution can be likewise formed on the processed substrate 3 by using the phase shifter 1, a crystal nucleus can be generated at a desired position, and the sufficient lateral growth from the crystal nucleus can be realized, thereby producing a crystallized semiconductor film with a large grain size. Moreover, in the third embodiment, like the second embodiment, the excellent crystallization can be realized without being affected by ablation in the processed substrate, and a positional relationship between the processed substrate 3 and the image forming optical system 6 can be adjusted.

FIGS. 11A to 11C are views illustrating a primary structure and an effect of a crystallization apparatus according to a modification of the third embodiment. Although the modification shown in FIGS. 11a to 11C has a structure similar to that of the third embodiment, it is basically different from the third embodiment in that a pupil of the image forming optical system 6 has a shape that a dimension along one direction and a dimension along the other direction are substantially different from each other. Taking notice of the difference from the third embodiment, the modification will be described hereinafter with reference to FIGS. 11A to 11C.

Referring to FIG. 11A, an aperture portion 6b of an aperture diaphragm 6a arranged at the pupil of the image forming optical system 6 has an elliptic shape instead of a circular shape. That is, dimensions of the pupil 6b of the image forming optical system 6 are maximum along a first direction (major axis direction) 17a, and it is minimum along a second direction (minor axis direction) 17b orthogonal to the first direction. Therefore, the blurring effect becomes minimum (resolution becomes highest) along the first direction 17a in which the pupil 6b of the image forming optical system 6 is largest, and the blurring effect becomes maximum (resolution becomes lowest) along the second direction 17b in which the pupil 6b is smallest.

As a result, an area 12b affected by the phase shift lines corresponding to the second direction 17b has a larger width at a part with a low light intensity than that of an area 12a affected by the phase shift lines corresponding to the first direction 17a. After light irradiation, since this light intensity distribution is converted into a heating temperature distribution and a thermal diffusivity is high in a state that the semiconductor is fused, and the temperature distribution is averaged by thermodiffusion in a fusing time. Therefore, there is a strong tendency that a low (deep) temperature state is maintained even after averaged by thermodiffusion as the width at the part with the low light intensity is larger. As a result, the area 12b with the large blurring effect has a low (deep) temperature, and the area 12a with the small blurring effect has a relatively high (shallow) temperature. As described above, in the modification of the third embodiment, a crystal nucleus 13 is generated in an area 11 corresponding to the point type phase shift portion 10e, and the lateral growth does not start along the areas 12a with a high (shallow) temperature, but the lateral growth starts along only the areas 12b with a low (deep) temperature by priority consequently, like the modification of the first embodiment, since the lateral growth advances without being affected by adjacent single crystals, larger crystal grains 14 than those in the third embodiment can be produced.

Figure 12:
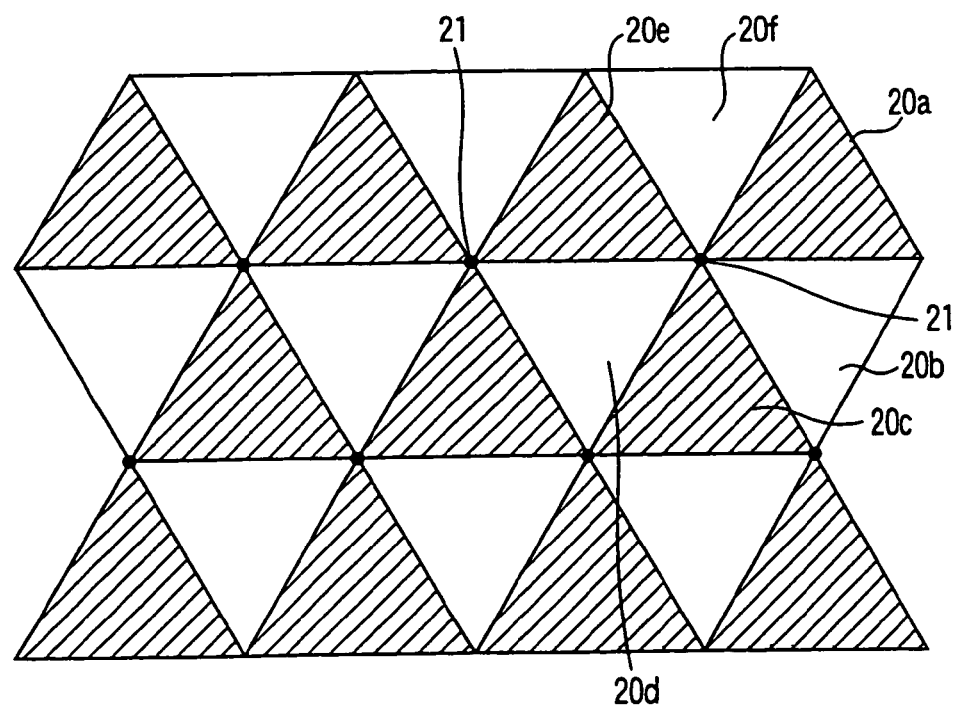
FIG. 12 is a view schematically showing another conformation of the phase shifter applicable to each embodiment and each modification.

In each of the foregoing embodiments, there is used the phase shifter 1 having the conformation that the four rectangular areas 10a to 10d are arranged so as to be adjacent to each other with one apex 10e in common. However, the present invention is not restricted thereto, it is possible to use a phase shifter of which basic unit has a structure that it has four or more even-numbered phase shift lines which intersect at a point constituting a phase shift portion and an area on one side and an area on the other side of each shift line have a phase difference of approximately 180 degrees. For example, as shown in FIG. 12, it is possible to use a phase shifter of which basic unit has a conformation that six or more triangular areas are arranged so as to be adjacent to each other with one apex in common. In this example, first to sixth triangular areas 20a to 20f constitute each basic unit section, a set of the first, third and fifth areas 20a, 20c and 20e and a set of the second, fourth and sixth areas 20b, 20d and 20f have a phase difference of 180 degrees. As a result, linear phase shift portions are formed between the adjacent areas, and an intersection of these phase shift portions is a phase shift point area or apex 21. In this case, a crystal nucleus is generated in an area corresponding to an apex 21 as the phase shift portion, and the lateral growth occurs along directions corresponding to the six phase shift lines. The modifications explained in connection with FIGS. 6A to 6C and FIGS. 11A to 11C can be also applied to the phase shifter depicted in FIG. 12.

In each of the above-described embodiments, the description has been given as to the example that the number of the phase shift lines which intersect at the phase shift portion is fixed (four or six). However, the present invention is not restricted thereto, and it is possible to adopt a phase shifter having a conformation that it has a first phase shift portion at which even-numbered first phase shift lines intersect and a second phase shift portion at which even-numbered second phase shift lines intersect and a plurality of first phase shift portions and a plurality of second phase shift portions are alternately arranged. For example, as shown in FIG. 13A, it is possible to use a phase shifter in which the four phase shift lines intersect at the first phase shift portion 1a and eight phase shift lines intersect at the second phase shift portion 1b.

In the phase shifter shown in FIG. 13A, a basic unit has four square areas. Each area is formed of two equilateral triangular areas each having a phase difference of 180 degrees. As a result, the first phase shift portion 1a corresponds to one apex provided to four triangular areas in common, the adjacent areas having a phase difference of 180 degrees. The second phase shift portion 1b corresponds to one apex provided to eight triangular areas in common, the adjacent areas having a phase difference of 180 degrees. Further, the first phase shift portions 1a and the second phase shift portions 1b are alternately arranged in vertical and horizontal directions. In this case, as shown in FIG. 13B, there is formed a predetermined light intensity distribution that a light intensity is minimum in each irradiation area 11b corresponding to the second phase shift portion 1b at which the eight phase shift lines intersect, the light intensity is second minimum in each area 11a corresponding to the first phase shift portion 1a at which the four phase shift lines intersect and the light intensity is relatively low in each area (indicated by broken lines in the drawing) corresponding to the phase shift lines. That is, a change gradient of the light intensity in each area 12d extending from the area 11b where the light intensity is minimum toward the area 11a where the light intensity is second minimum is smaller than a change gradient of the light intensity in each area 12c extending from the area 11b where the light intensity is minimum toward another area 11b where the light intensity is minimum. That is because the light intensity in the middle portion is lowered since the area 11a is interposed between two areas 11b. As a result, as shown in FIG. 13C, a crystal nucleus 13 is generated at a position on the processed substrate corresponding to the minimum light intensity area 11b, and the lateral growth advances toward the areas 11a where the light intensity is second minimum.

Therefore, in this embodiment, the crystal nucleus generation position and the lateral growth direction can be accurately specified.

Figure 14A:
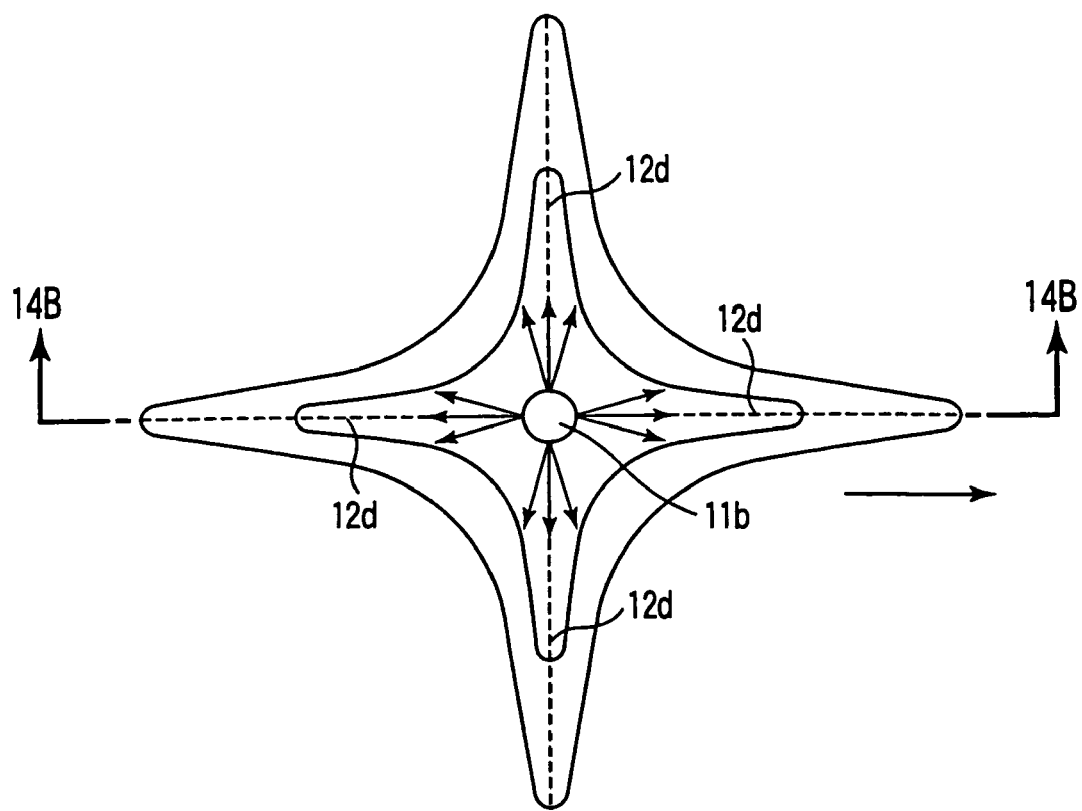
FIG. 14A is a view typically showing a light intensity distribution obtained on the processed substrate by using the phase shifter depicted in FIG. 13 by contour lines in the first embodiment.

FIG. 14A is a view typically showing a light intensity distribution obtained on the processed substrate by using the phase shifter depicted in FIG. 13A by contour lines in the first embodiment. This light intensity distribution typically shows a simulation result obtained based on a specific numerical example. In this numerical example, it is assumed in the phase shifter illustrated in FIG. 13A that dimensions of the square in the basic unit formed of the eight triangular areas are 10 μm×10 μm, a wavelength $\lambda$ of the light is 248 nm, a distance D between the phase shifter and the processed substrate is 32 μm and a shape of a surface light source formed to the outgoing radiation pupil (rear focal plane of the second fly-eye lens 2e) of the illumination system 2 is a circle (i.e., a circular illumination).

Figure 14B:
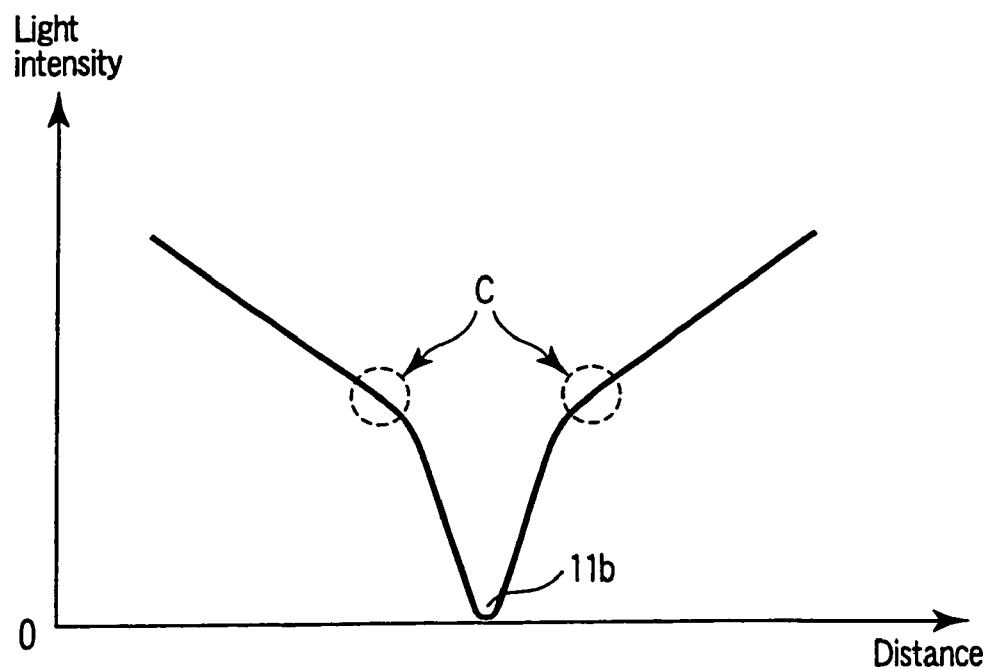
FIG. 14B is a view showing a light intensity distribution taken along the line 14B-14B in FIG. 14A.

In this example, such a light intensity distribution as shown in FIG. 14A can be obtained. This distribution has an inverse peak point 11b with a light intensity lower than that at the periphery and four trough lines 12d each of which extends from the inverse peak point 11b toward the periphery and has a lower change gradient of the light intensity than that at the periphery. When this intensity distribution is seen from the lateral direction, the distribution is as shown in FIG. 14B. Referring to this figure, it can be understood that the light intensity distribution along the trough lines 12d (along the line 14B-14B in FIG. 14A) has inflection points C. This inflection point C is an intersection of the high light intensity portion of the peak in the inverse peak pattern and the linearly extending area with a gentle gradient from the high light intensity portion. Thus, in the modification using the phase shifter shown in FIG. 13A, a crystal nucleus 13 is generated in the area 11b corresponding to the second phase shift portion 1b where the light intensity is minimum.

Furthermore, the lateral growth is hard to start along the area 12c corresponding to the phase shift line extending from one second phase shift portion 1b toward the other second phase shift portion 1b, but the lateral growth starts by priority along the area 12d corresponding to the phase shift line extending from the second phase shift portion 1b toward the first phase shift portion 1a. Since the lateral growth along these areas 12d is not affected by the adjacent lateral growth, relatively large crystal grains 14 can be generated. By using the phase shifter in which the phase shift portions having different numbers of the intersecting phase shift lines are alternately arranged in this manner, the light intensity distribution obtained on the processed substrate can be readily controlled, thereby increasing a degree of freedom in design.

The modifications described in connection with FIGS. 6A to 6C and FIGS. 11A to 11C can be likewise applied to the phase shifter shown in FIG. 13A.

In the modifications respectively explained with reference to FIGS. 6A to 6C and FIGS. 11A to 11C, the outgoing radiation pupil of the illumination system 2 and the pupil 6b of the image forming optical system 6 are set to a circular shape. However, the present invention is not restricted thereto, and it is possible to set the outgoing radiation pupil of the illumination system 2 and the pupil 6b of the image forming optical system 6 to have a shape that a dimension along one direction and a dimension along the other direction are substantially different from each other (e.g., a rectangular).

A description will now be given as to a phase shifter which can be used in a crystallization apparatus according to a second modification of the first embodiment with reference to FIGS. 15A to 15C.

Figures 15A, 15B:
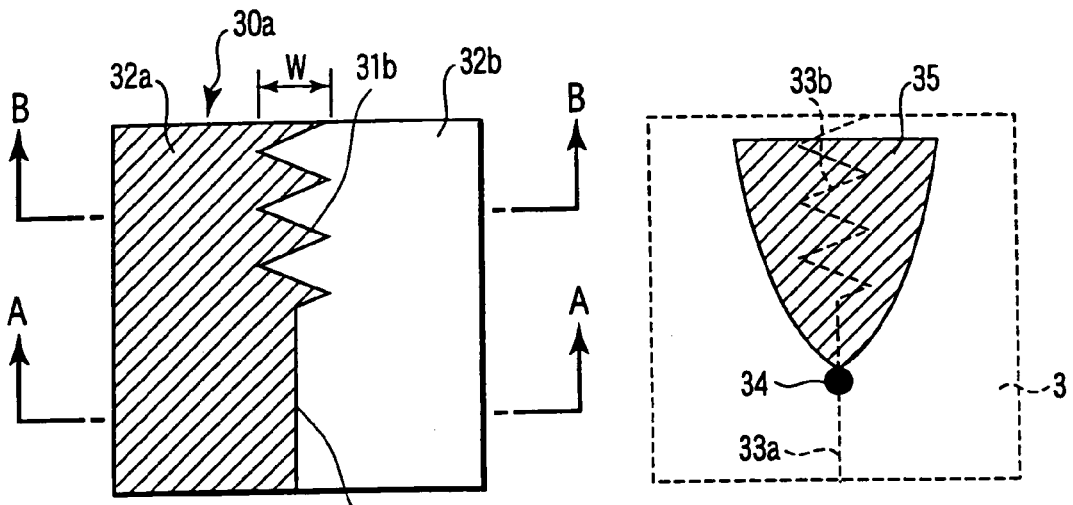
FIGS. 15A and 15B are views schematically showing a structure and an effect of a basic unit part of a phase shifter used in a second modification of the first embodiment.

FIGS. 15A and 15B are views schematically showing a structure and an effect of a basic unit of the phase shifter. FIG. 15C is a view typically showing a light intensity distribution obtained on the processed substrate by using a phase shifter depicted in FIG. 15A. Referring to FIG. 15A, a basic unit 30 of the phase shifter has a first phase shift line 31a which linearly extends along a vertical direction in the drawing and a second phase shift line 31b which meanders along the vertical direction in the drawing, a left side area 32a in the figure and a right side area 32b in the figure of the first phase shift line 31a and the second phase shift line 31b has a phase difference of 180 degrees.

That is, with the transmitted light in the first area 32a being determined as a reference, a phase difference of 180 degrees is given to the transmitted light in the second area 32b. Specifically, when the phase shifter is formed of, e.g., quartz glass having a refractive index of 1.5 with respect to the light having a wavelength of 248 nm, a step of 248 nm is given between the first area 32a and the second area 32b.

When the phase shifter and the processed substrate are arranged so as to be appressed against each other, a light intensity distribution with a low light intensity is formed only at a part corresponding to the phase shift lines 31a and 31b. However, since the phase shifter 1 and the processed substrate 3 are arranged in close proximity to each other in the first embodiment shown in FIG. 3, there is formed a light intensity distribution with an inverse peak pattern that a light intensity is low in line areas 33a and 33b corresponding to the phase shift lines 31a and 31b and the light intensity is suddenly increased along a direction orthogonal to the line areas 33a and 33b by a so-called defocus effect (blurring effect) as shown in FIG. 15C.

Figure 15C:
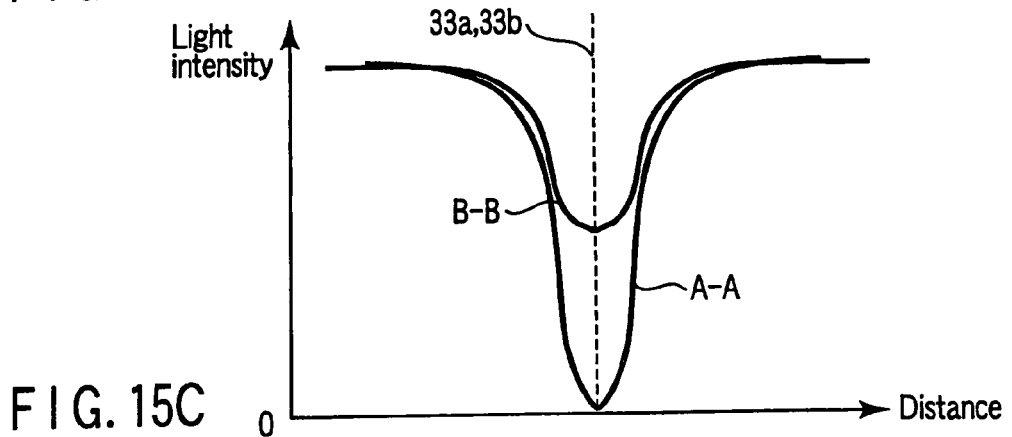
FIG. 15C is a view typically showing a light intensity distribution obtained on the processed substrate by using the phase shifter illustrated in FIG. 15A.

In FIG. 15C, a light intensity distribution indicated by reference character A-A represents a light intensity distribution along a direction corresponding to a direction indicated by a line A-A in FIG. 15A (direction orthogonal to the first phase shift line 31a), and a light intensity distribution indicated by reference character B-B represents a light intensity distribution along a direction corresponding to a direction indicated by a line B-B in FIG. 15A (direction orthogonal to the second phase shift line 31b). As shown in FIG. 15C, the light intensity in the line area 33b corresponding to the meandering second phase shift line 31b is substantially higher than the light intensity in the line area 33a corresponding to the linear first phase shift line 31a. That is because the light intensity distribution in a range of a shaped width W as a gap between a minimum position and a maximum position of meandering (see FIG. 15A) is averaged by a synergistic effect of meandering of the second phase shift line 31b and the defocus effect (blurring effect), and the light intensity of the inverse peak becomes high (shallow).

That is, as the shaped width W of meandering of the second phase shift line 31b becomes larger, the light intensity in the line area 33b corresponding to the second phase shift line 31b is increased. Further, the light intensity is averaged on the boundary between the line area 33a and the line area 33b, and it smoothly varies from a high value to a low value. As described above, in the light intensity distribution on the processed substrate 3, the light intensity is minimum in the line area 33a corresponding to the first phase shift line 31a, and a trough line in which a change gradient of the light intensity is lower than that at the periphery is formed toward the line area 33b corresponding to the second phase shift line 31b from the line area 33a corresponding to the first phase shift line 31a. Therefore, in this modification of the first embodiment, a crystal nucleus 34 is generated on the line area 33a corresponding to the linear first phase shift line 31a as shown in FIG. 15B.

Moreover, since the light intensity distribution in the trough line formed toward the second phase shift line 31b from the first phase shift line 31a does not involve irregular undulations (wavelike distribution that an increase and a decrease in light intensity are repeated), the lateral growth which has started along the trough line from the crystal nucleus 34 does not stop in mid course, and a crystal grain 35 with a large particle size is generated. As described above, in this example based on a so-called proximity method (defocus method), a crystal nucleus can be generated at a position desired to some extent by a combination of the linear phase shift line and the meandering phase shift line, and the sufficient lateral growth from the crystal nucleus can be realized in a desired direction, thereby producing a crystallized semiconductor film with a large particle size.

Figures 16A, 16B:
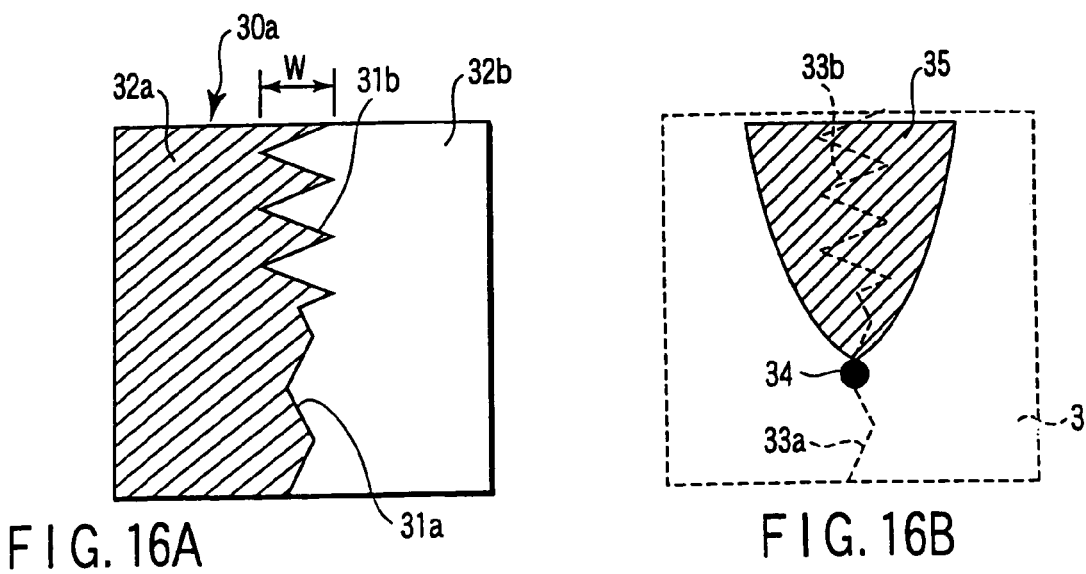
FIGS. 16A and 16B are views schematically showing a structure and an effect of a phase shifter used in a third modification of the first embodiment.

FIGS. 16A and 16B are views schematically showing a structure and an effect of a phase shifter which can be used in a third modification of the first embodiment. Although this phase shifter has a structure similar to that of the phase shifter used in the second modification, it is basically different from the first embodiment in that the first phase shift line 31a is not linear but meandering with a shaped width substantially smaller than the shaped width W of the second phase shift line 31b. Taking notice of the difference from the second modification, the third modification will now be described.

Referring to FIG. 16A, a basic unit part 30a of the phase shifter has a first phase shift line 31a which meanders with a relatively small shaped width along a vertical direction in the drawing and a second phase shift line 31b which meanders with a relatively large shaped width W along the vertical direction in the drawing, and an area 32a on the left side in the figure and an area 32b on the right side in the figure with the first phase shift line 31a and the second phase shift line 31b therebetween have a phase difference of 180 degrees. In this case, since a light intensity in the line area corresponding to the phase shift line is increased as the shaped width of meandering becomes larger as described above, the light intensity in the line area 33b corresponding to the second phase shift line 31b is substantially higher than the light intensity in the line area 33a corresponding to the first phase shift line 31a.

As a result, in the light intensity distribution on the processed substrate 3, the light intensity in the line area 33a corresponding to the first phase shift line 31a is minimum, and a trough line with a lower change gradient of the light intensity than that at the periphery is formed toward the line area 33b corresponding to the second phase shift line 31b from the line area 33a corresponding to the first phase shift line 31a. Therefore, a crystal nucleus 34 is generated on the line area 33a corresponding to the first phase shift line 31a, the lateral growth which has started from the crystal nucleus 34 along the trough line does not stop in mid course, and a crystal grain 35 with a large particle size is produced. That is, in the phase shifter shown in FIG. 16A, a crystal nucleus can be generated at a position desired to some extent by a combination of the phase shift line which meanders with a large shaped width and the phase shift line which meanders with a small shaped width (by modulation of the shaped widths of the meandering phase shift lines), and the sufficient lateral growth can be realized from the crystal nucleus, thereby producing a crystallized semiconductor film with a large particle size.

Figure 17A:
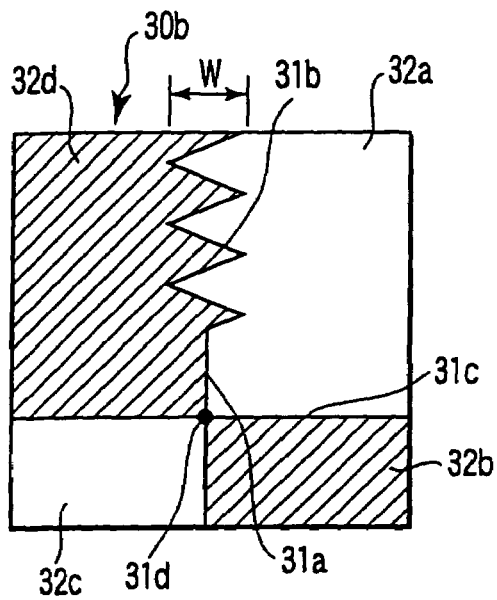
FIGS. 17A and 17B are views schematically showing a structure and an effect of a phase shifter which can be used in a crystallization apparatus according to a fourth modification of the first embodiment.
Figure 17B:
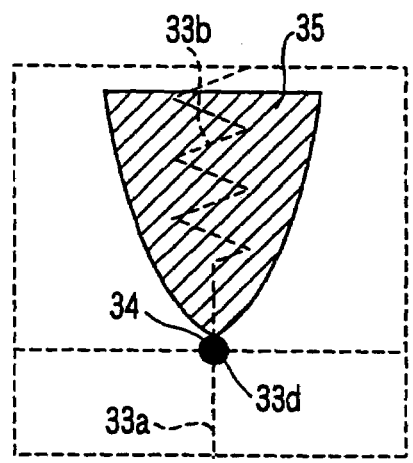

FIGS. 17A and 17B are views schematically showing a structure and an effect of a phase shifter used in a crystallization apparatus according to a fourth modification of the first embodiment. Although the phase shifter according to this fourth modification has a structure similar to that of the phase shifter according to the second modification, it is basically different from the phase shifter according to the second modification in that a linear third phase shift line 31c orthogonal to the first phase shift line 31a is additionally provided. Taking notice of the difference from the first embodiment, the fourth modification will be described hereinafter.

Referring to FIG. 17A, a basic unit 30b of the phase shifter has a first phase shift line 31a which linearly extends along a vertical direction in the drawing, a second phase shift line 31b which meanders along the vertical direction in the drawing, and a third phase shift line 31c which linearly extends in a horizontal direction in the drawing and crosses the first phase shift line 31a. Areas 32d and 32c on the left side in the figure and areas 32a and 32d on the right side in the figure with the first phase shift line 31a and the second phase shift line 31b therebetween have a phase difference of 180 degrees, and areas 32a and 32b on the upper side in the figure and areas 32c and 32d on the lower side in the figure have a phase difference of 180 degrees. That is, the first area 32a and the third area 32c are in phase, and the second area 32b and the fourth area 32d have a phase difference of 180 degrees. In this case, an intersection 31d of the first phase shift line 31a and the third phase shift line 31c constitutes a phase shift portion like the phase shifter shown in FIG. 4A.

As a result, in the light intensity distribution on the processed substrate 3, the light intensity is minimum in the area 33d corresponding to the phase shift portion 31d, and a trough line that a change gradient of the light intensity is lower than that at the periphery is formed toward the line area 33b corresponding to the second phase shift line 31b from the line area 33a corresponding to the first phase shift line 31a. As shown in FIG. 17B, therefore, a nucleus 34 is formed the area 33d corresponding to the phase shift portion 31d, the lateral growth which has started from the crystal nucleus 34 along the trough line does not stop in mid course, the a crystal grain 35 with a large particle size is produced. That is, in this modification, and a crystal nucleus 34 can be more accurately generated at a desired position than the second and third modifications by additionally providing the linear third phase shift line 31c orthogonal to the first phase shift line 31a.

Figure 18:
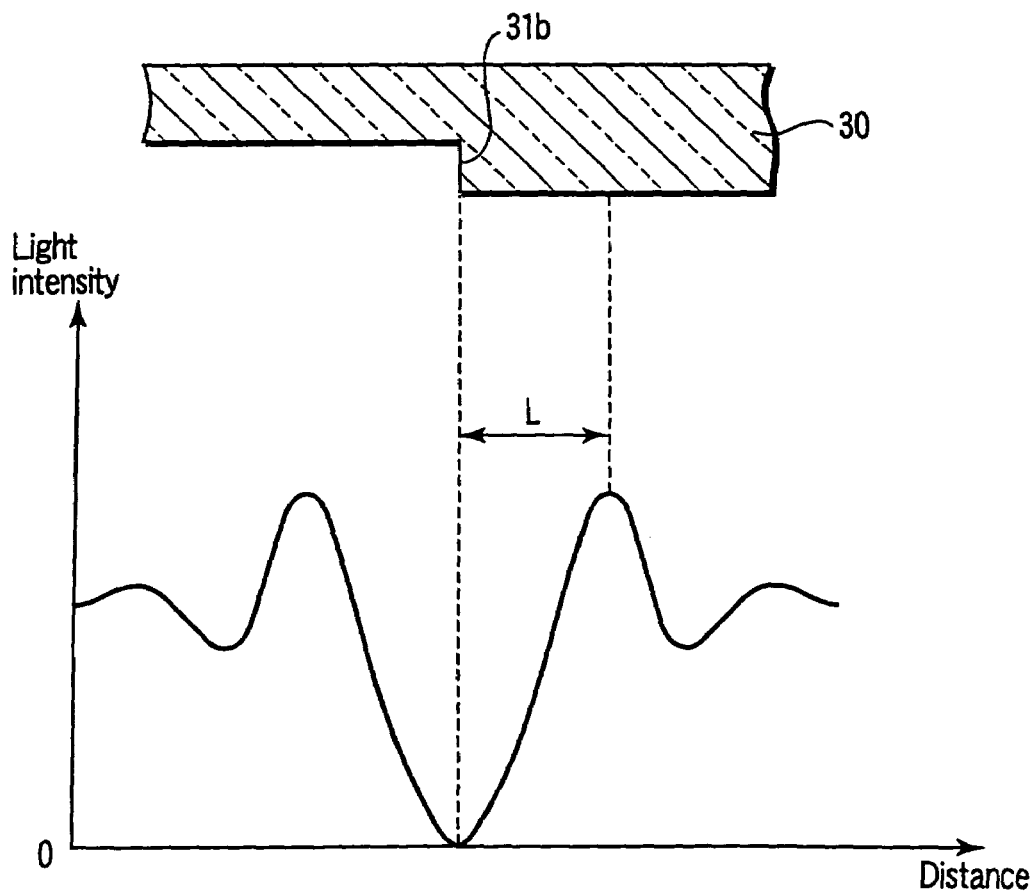
FIG. 18 is a view illustrating a magnitude of a shaped width W required for a meandering second phase shift line in the second to fourth modifications.

FIG. 18 is a view illustrating a size of a shaped width W required for the meandering second phase shift line in the second to fourth modifications. Referring to FIG. 18, in the light intensity distribution formed on the processed substrate by the phase shifter, a half value width L of the inverse peak pattern obtained along a direction orthogonal to the phase shift line with the linear shift line at the center can be represented by the above-described expression (1).

In order to increase the light intensity in the line area 33b corresponding to the meandering second phase shift line 31b to a necessary degree by the above-described light intensity averaging effect, it is preferable that the shaped width W of the second phase shift line 31b is larger than the half value width L, i.e., that the following conditional expression (5) is satisfied.

$$W > 1.2 \times (\lambda D/2)^{1/2} \quad (5)$$

However, the light intensity averaging effect of the present invention can be sufficiently obtained when the shaped width W of the second phase shift line 31b satisfies the following conditional expression (6) obtained by multiplying a value on the right side of an inequality sign in the conditional expression (5) by a coefficient 0.5.

$$W > 0.6 \times (\lambda D/2)^{1/2} \quad (6)$$

It can be readily understood by persons skilled in the art that the phase shifter described in connection with the second to fourth modifications of the first embodiment can be also used as the phase shifter of the crystallization apparatus according to the second to third embodiments.

When the second to fourth phase shifters of the first embodiment are used as the modification of the third embodiment based on the projection NA method, the blurring effect can be obtained on the processed substrate by setting the image side numerical aperture NA of the image forming optical system 6 to be small. A blurring quantity B obtained by a reduction in resolution can be represented by the following expression (7).

$$B = 0.61 \times \lambda/NA \quad (7)$$

A constant 0.61 in the expression (7) indicates a distance (radius) required to obtain zero first from the center in the light intensity distribution acquired in case of the complete coherent illumination. In the actual optical system, since the complete coherent illumination cannot be obtained, a value of this constant is different, but it is a value of approximately 1. In order to increase the light intensity in the line area 33b corresponding to the meandering second phase shift line 31b to a necessary degree by the above-described blurring effect, it is preferable that the shaped width W of the second phase shift line 31b is larger than the blurring quantity B, i.e., that the following conditional expression (8) is satisfied.

$$W > 0.61 \times \lambda/NA \quad (8)$$

However, the blurring effect of the present invention can be sufficiently obtained when the shaped width W of the second phase shift line 31b satisfies the following conditional expression (9) acquired by multiplying a value on the right side of an inequality sign in the conditional expression (8) by a coefficient 0.5.

$$W > 0.305 \times \lambda/NA \quad (9)$$

Furthermore, in each embodiment and each modification mentioned above, the phase shift line which meanders substantially in the zigzag form with triangular waves is described as the meandering phase shift line. However, the present invention is not restricted thereto, and it is possible to adopt various modifications of the meandering phase shift line, e.g., a phase shift line which meanders in the sine curve form or a step-like phase shift line which entirely meanders in the zigzag form or the sine curve form. At this time, an amplitude and a pitch of meandering do not have to be the same in all the examples. For example, it is possible to employ meandering that the amplitude becomes large as distanced from the phase shift portion or meandering that the pitch becomes small or vice versa.

In each of the foregoing embodiments, although the light intensity distribution can be calculated on a design stage, it is desirable to observe and confirm the light intensity distribution on the actual processed surface (exposed surface). In order to realize this, zooming the processed surface by the optical system and performing input by an imaging element such as a CCD can suffice. When the light to be used is an ultraviolet light beam, since the optical system is restricted, a fluorescent screen may be provided to the processed surface in order to convert the light into a visible light beam.

Figure 19A:
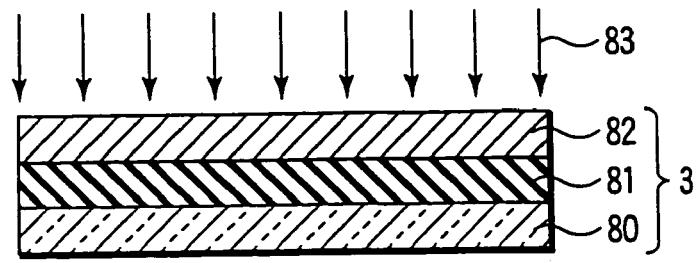
FIGS. 19A to 19E are process cross-sectional views showing processes to manufacture an electronic device by using the crystallization apparatus according to each embodiment.

FIGS. 19A to 19E are process cross-sectional views showing processes to manufacture an electronic device by using a crystallization apparatus according to each embodiment. As shown in FIG. 19A, the processed substrate 3 is prepared by forming an underlying film 81 (e.g., SiN having a film thickness of 50 nm and an $SiO_2$ laminated film having a film thickness of 100 nm) and an amorphous (or polycrystal) semiconductor film 82 (e.g., Si, Ge, SiGe or the like having a film thickness of approximately 50 nm to 200 nm) on a transparent insulating substrate 80 (e.g., alkali glass, quartz glass, plastic, polyimide or the like) by a chemical vapor deposition method or a sputtering method. Then, as indicated by arrows, the crystallization apparatus according to each embodiment is used to irradiate a part or all of the surface of the amorphous semiconductor film 82 with a laser beam 83 (e.g., a KrF excimer laser beam or an XeCl excimer laser beam) modulated to have a light intensity distribution with an inverse peak pattern by the phase shifter as described above.

Figure 19B:
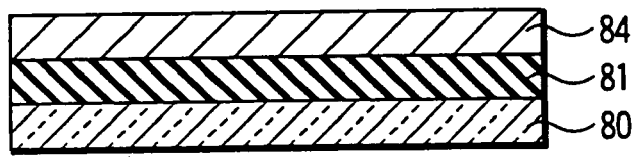
Figure 19C:
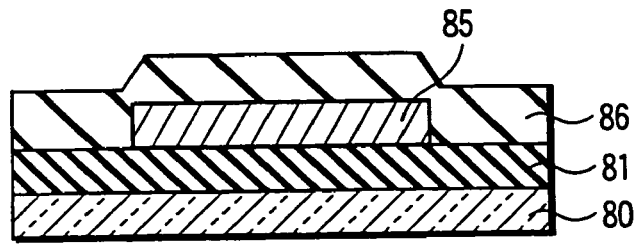
Figure 19D:
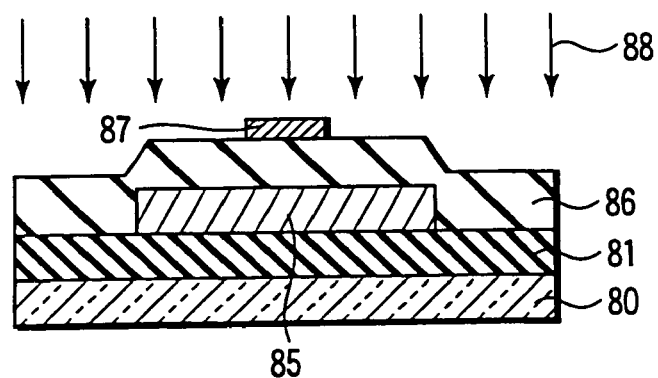
Figure 19E:
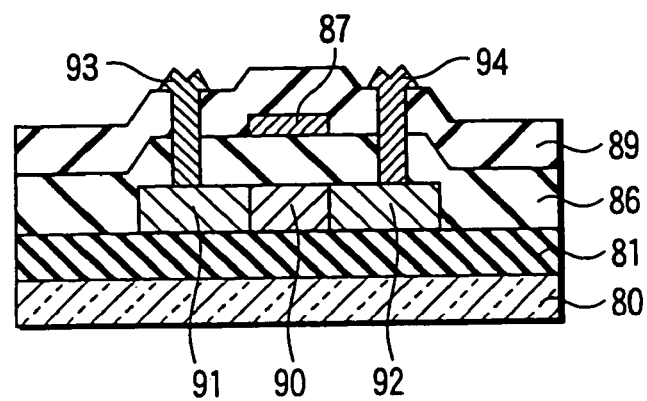

As a result, as shown in FIG. 19B, the amorphous semiconductor of the amorphous semiconductor film 82 is crystallized, and a crystallized semiconductor film (a polycrystal semiconductor film or a monocrystal semiconductor film) 84 having crystal grains with a larger particle size is generated. Subsequently, as shown in FIG. 19C, the polycrystal semiconductor film or the monocrystallized semiconductor film 84 is processed into an island-shaped semiconductor film 85 by using the photolithography technology, and an $SiO_2$ film having a film thickness of 20 nm to 100 nm as a gate insulating film 86 is formed on the monocrystallized semiconductor film 85 and the underlying film 81 by using the chemical vapor deposition method or the sputtering method. Moreover, as shown in FIG. 19D, a gate electrode 87 (e.g., silicide or MoW) is selectively formed on the gate oxide film 86 so as to correspond to the central part of the crystallized semiconductor film 85. Then, as indicated by arrows, impurity ions 88 (phosphor incase of an N channel transistor, boron in case of a P channel transistor) are selectively implanted into the crystallized semiconductor film 85 with the gate electrode 87 being used as a mask. Thereafter, annealing processing (e.g., one hour at 450° C.) is performed in a nitrogen atmosphere, the impurities in the crystallized semiconductor film 85 are activated, and a source area 91 and a drain area 92 are formed with a channel 90 therebetween as shown in FIG. 19E. Then, an interlayer insulating film 89 is formed on the gate oxide film 86 and the gate electrode 87. Contact holes are formed to the interlayer insulating film 89 and the gate oxide film 86, and a source electrode 93 and a drain electrode 94 connected with the source area 91 and the drain area 92 are formed.

In the above-described processes, a position of the channel 90 is set in accordance with a position of the crystal with a large particle size of the crystallized semiconductor film 84 generated in the processes shown in FIGS. 19A and 19B. This positioning can be readily and assuredly performed since the crystal nucleus formation position accuracy is high in the above-described crystallization technology according to the present invention. As a result, it is possible to form a polycrystal semiconductor transistor or a monocrystal semiconductor transistor having the channel 90 with the high electron mobility can be formed. The thus manufactured thin film transistor can be applied to a drive circuit for, e.g., a liquid crystal display or an EL (electroluminescence) display or an integrated circuit of, e.g., a memory (SRAM or DRAM) or a CPU.

Although the above has described as to the case that the crystallization technology according to the present invention is applied to manufacture of the thin film transistor, this technology can be also applied to manufacture of any other semiconductor element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization apparatus comprising an illumination system which illuminates a phase shifter having at least one phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, wherein the phase shifter has four or more even-numbered phase shift lines which intersect at a point constituting the phase shift portion, and an area on one side and an area on the other side of each phase shift line have a phase difference of approximately 180 degrees, and the phase shifter has a conformation that six or more triangular areas including said areas are arranged so as to be adjacent to each other with one apex in common.

2. A crystallization apparatus comprising an illumination system which illuminates a phase shifter having at least one phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, wherein the phase shifter has four or more even-numbered phase shift lines which intersect at a point constituting the phase shift portion, and an area on one side and an area on the other side of each phase shift line have a phase difference of approximately 180 degrees, and the phase shifter has a first phase shift portion at which even-numbered first phase shift lines intersect and a second phase shift portion at which even-numbered second phase shift lines intersect, and a plurality of first phase shift portions and a plurality of second phase shift portions are alternately arranged.

3. The crystallization apparatus according to claim 2, wherein the first phase shift portion corresponds to a point at which the four phase shift lines intersect, and the second phase shift portion corresponds to a point at which the eight phase shift lines intersect.

4. The crystallization apparatus according to claim 3, wherein the first phase shift portion corresponds to one apex provided to the four triangular areas including said areas in common, and the second phase shift portion corresponds to one apex provided to the eight triangular areas in common.

5. A crystallization apparatus comprising an illumination system which illuminates a phase shifter having at least one phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, wherein the phase shifter has four or more even-numbered phase shift lines which intersect at a point constituting the phase shift portion, and an area on one side and an area on the other side of each phase shift line have a phase difference of approximately 180 degrees, and the illumination system has an outgoing radiation pupil having a shape that a dimension along one direction and a dimension along the other direction are substantially different from each other.

6. The crystallization apparatus according to claim 5, wherein assuming that D is a distance between the polycrystal semiconductor film or the amorphous semiconductor film and the phase shifter, $\lambda$ is a wavelength of the light, $\theta$max is a maximum incident angle of the light upon the phase shifter along a direction in which an outgoing radiation pupil of the illumination system is maximum, and $\theta$min is a maximum incident angle of the light upon the phase shifter along a direction in which the outgoing radiation pupil of the illumination system is minimum, the following conditions are satisfied:

$D \times \tan(\theta min) < 1.2 \times (\lambda D/2)^{1/2}$ $D \times \tan(\theta max) > 1.2 \times (\lambda D/2)^{1/2}$.

7. A crystallization apparatus comprising an illumination system which illuminates a phase shifter having at least one phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, wherein the phase shifter has four or more even-numbered phase shift lines which intersect at a point constituting the phase shift portion, and an area on one side and an area on the other side of each phase shift line have a phase difference of approximately 180 degrees, and further comprising an image forming optical system arranged on an optical axis between the polycrystal semiconductor film or the amorphous semiconductor film and the phase shifter, and wherein the polycrystal semiconductor film or the amorphous semiconductor film is set apart from a surface optical conjugate with the phase shifter by a predetermined distance along an optical axis of the image forming optical system.

8. A crystallization apparatus comprising an illumination system which illuminates a phase shifter having at least one phase shift portion, and irradiates a polycrystal semiconductor film or an amorphous semiconductor film with a light beam having a predetermined light intensity distribution in which a light intensity is minimum in a point area corresponding to the phase shift portion of the phase shifter, thereby forming a crystallized semiconductor film, wherein the phase shifter has four or more even-numbered phase shift lines which intersect at a point constituting the phase shift portion, and an area on one side and an area on the other side of each phase shift line have a phase difference of approximately 180 degrees, and further comprising an image forming optical system arranged on a light path between the polycrystal semiconductor film or the amorphous semiconductor film and the phase shifter, and wherein the polycrystal semiconductor film or the amorphous semiconductor film is set to a surface which is optically substantially conjugate with the phase shifter, and an image side numerical aperture of the image forming optical system is set to a value used to generate the light intensity distribution.

9. The crystallization apparatus according to claim 8, wherein the image forming optical system has a pupil having a shape that a dimension along one direction and a dimension along the other direction are substantially different from each other.

10. A crystallization apparatus which forms a crystallized semiconductor film by irradiating a polycrystal semiconductor film or an amorphous semiconductor film with a light beam having a predetermined light intensity distribution, wherein the predetermined light intensity distribution has an inverse peak point with a light intensity lower than that at the periphery and has two or more trough lines which extend from the inverse peak point toward the periphery and have a lower change gradient of a light intensity than that at the periphery, and the light intensity distribution along each of the trough lines has an inflection point.

11. A crystallization method which illuminates a phase shifter, and irradiates a polycrystal semiconductor film or an amorphous semiconductor film with a light beam having a predetermined light intensity distribution that a light intensity is minimum in an area corresponding to a phase shift portion of the phase shifter, thereby generating a crystallized semiconductor film, wherein the method uses the phase shifter which has four or more even-numbered phase shift lines which intersect at a point constituting the phase shift portion, an area on one side and an area on the other side of each phase shift line having a phase difference of approximately 180 degrees, an image forming optical system is arranged on a light path between the polycrystal semiconductor film or the amorphous semiconductor film and the phase shifter, and a surface of the polycrystal semiconductor film or the amorphous semiconductor film being set apart from a plane optically conjugate with the phase shifter by a predetermined distance along an optical axis of the image forming optical system.

12. A crystallization method which illuminates a phase shifter, and irradiates a polycrystal semiconductor film or an amorphous semiconductor film with a light beam having a predetermined light intensity distribution that a light intensity is minimum in an area corresponding to a phase shift portion of the phase shifter, thereby generating a crystallized semiconductor film, wherein the method uses the phase shifter which has four or more even-numbered phase shift lines which intersect at a point constituting the phase shift portion, an area on one side and an area on the other side of each phase shift line having a phase difference of approximately 180 degrees, an image forming optical system is arranged on a light path between the polycrystal semiconductor film or the amorphous semiconductor film and the phase shifter, an image side numeral aperture of the image forming optical system is set to a value used to generate the predetermined light intensity distribution, and the polycrystal semiconductor film or the amorphous semiconductor film is set to a position optical conjugate with the phase shifter through the image forming optical system.

13. A phase shifter which has four or more even-numbered phase shift lines which intersect at a point constituting a phase shift portion, wherein respective two adjacent areas with different phases which define each phase shift line therebetween have a phase difference of approximately 180 degrees, and
wherein six or more triangular areas including said areas are arranged so as to be adjacent to each other with one apex in common.

14. A phase shifter which has four or more even-numbered phase shift lines which intersect at a point constituting a phase shift portion, wherein respective two adjacent areas with different phases which define each phase shift line therebetween have a phase difference of approximately 180 degrees, and
further comprising a first phase shift portion at which even-numbered first phase shift lines intersect and a second phase shift portion at which even-numbered second phase shift lines intersect, wherein a plurality of first phase shift portions and a plurality of second phase shift portions are alternately arranged.

15. The phase shifter according to claim 14, wherein the first phase shift portion corresponds to a point at which the four phase shift lines intersect, and the second phase shift portion corresponds to a point at which the eight phase shift lines intersect.

16. The phase shifter according to claim 15, wherein the first phase shift portion corresponds to one apex provided to four triangular areas in common, and the second phase shift portion corresponds to one apex provided to eight triangular areas in common.

17. The crystallization apparatus according to claim 11, wherein the phase shifter has a conformation that six or more triangular areas including said areas are arranged so as to be adjacent to each other with one apex in common.

18. The crystallization apparatus according to claim 11, wherein the phase shifter has a first phase shift portion at which even-numbered first phase shift lines intersect and a second phase shift portion at which even-numbered second phase shift lines intersect, and a plurality of first phase shift portions and a plurality of second phase shift portions are alternately arranged.

19. The crystallization apparatus according to claim 11, wherein the first phase shift portion corresponds to a point at which the four phase shift lines intersect, and the second phase shift portion corresponds to a point at which the eight phase shift lines intersect.

20. The crystallization apparatus according to claim 13, wherein the phase shifter has a conformation that six or more triangular areas including said areas are arranged so as to be adjacent to each other with one apex in common.

21. The crystallization apparatus according to claim 13, wherein the phase shifter has a first phase shift portion at which even-numbered first phase shift lines intersect and a second phase shift portion at which even-numbered second phase shift lines intersect, and a plurality of first phase shift portions and a plurality of second phase shift portions are alternately arranged.

22. The crystallization apparatus according to claim 13, wherein the first phase shift portion corresponds to a point at which the four phase shift lines intersect, and the second phase shift portion corresponds to a point at which the eight phase shift lines intersect.

* * * * *